United States Patent
Kwon et al.

(10) Patent No.: US 10,274,742 B2
(45) Date of Patent: Apr. 30, 2019

(54) DISPLAY DEVICE

(71) Applicant: Samsung Display Co., Ltd., Yongin-si, Gyeonggi-do (KR)

(72) Inventors: Jae Joong Kwon, Suwon-si (KR); Jung-Hun Noh, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/906,789

(22) Filed: Feb. 27, 2018

(65) Prior Publication Data

US 2018/0284465 A1 Oct. 4, 2018

(30) Foreign Application Priority Data

Mar. 29, 2017 (KR) .................. 10-2017-0040274

(51) Int. Cl.
*G02B 27/22* (2018.01)
*H01L 27/15* (2006.01)
(Continued)

(52) U.S. Cl.
CPC ........ *G02B 27/225* (2013.01); *H01L 27/1463* (2013.01); *H01L 27/14603* (2013.01);
(Continued)

(58) Field of Classification Search
CPC ......... H01L 27/14627; H01L 27/14625; H01L 31/02327; H01L 33/58; H01L 51/5275;
(Continued)

(56) References Cited

U.S. PATENT DOCUMENTS 9,383,588 B2 7/2016 Raymond et al.
2006/0027732 A1* 2/2006 Ahn .................. H01L 27/14603
250/208.1
(Continued)

FOREIGN PATENT DOCUMENTS

JP 2016-029419 A 3/2016
KR 10-2015-0110962 A 10/2015
KR 10-1627337 5/2016

OTHER PUBLICATIONS

Liu, Yue-Feng, et al.; "Omnidirectional emission from top-emitting organic light-emitting devices with microstructured cavity"; Optics Letters; vol. 37, No. 2; Jan. 15, 2012; 3 pages.
(Continued)

*Primary Examiner* — Ngan V Ngo
(74) *Attorney, Agent, or Firm* — Innovation Counsel LLP

(57) ABSTRACT

This disclosure relates to a display device including a lens array unit. An exemplary embodiment of the present inventive concept provides a display device including: a display unit including a plurality of pixels; and a lens array unit including a plurality of lenses, wherein a first lens of the plurality of lenses corresponds to and overlaps two or more of the plurality of pixels, the two or more pixels include a first pixel and a second pixel, the first pixel is closer to an optical axis of the first lens than the second pixel is in a plan view, and a shortest distance between the first pixel and a reference surface that is perpendicular to the optical axis of the first lens is greater than a shortest distance between the reference surface and the second pixel.

14 Claims, 22 Drawing Sheets

(51) Int. Cl.
*H01L 27/32* (2006.01)
*H01L 33/58* (2010.01)
*H01L 33/62* (2010.01)
*H01L 51/52* (2006.01)
*H01L 27/146* (2006.01)
*H01L 31/0232* (2014.01)

(52) U.S. Cl.
CPC .. *H01L 27/14605* (2013.01); *H01L 27/14609* (2013.01); *H01L 27/14625* (2013.01); *H01L 27/14627* (2013.01); *H01L 27/156* (2013.01); *H01L 27/326* (2013.01); *H01L 27/3248* (2013.01); *H01L 27/3258* (2013.01); *H01L 31/02327* (2013.01); *H01L 33/58* (2013.01); *H01L 33/62* (2013.01); *H01L 51/5275* (2013.01); *H01L 2251/5338* (2013.01)

(58) Field of Classification Search
CPC .......... H01L 27/14605; H01L 27/1463; H01L 27/14603; H01L 27/14609
See application file for complete search history.

(56) References Cited

U.S. PATENT DOCUMENTS

| | | | |
|---|---|---|---|
| 2007/0053037 A1* | 3/2007 | Kang | H01L 27/14621 359/204.1 |
| 2009/0020690 A1* | 1/2009 | Toda | G02B 5/188 250/227.2 |
| 2009/0109490 A1 | 4/2009 | Lau et al. | |
| 2011/0221599 A1* | 9/2011 | Hogasten | H01L 27/14609 340/632 |
| 2011/0273597 A1* | 11/2011 | Ishiwata | H01L 27/14603 348/272 |
| 2012/0249846 A1* | 10/2012 | Nishio | H01L 27/14603 348/294 |
| 2013/0155503 A1* | 6/2013 | Yen | H04N 13/0404 13/404 |
| 2013/0169518 A1* | 7/2013 | Wu | G02B 27/2214 345/88 |
| 2014/0218664 A1* | 8/2014 | Nimura | G02F 1/133526 349/95 |
| 2015/0331280 A1* | 11/2015 | Wakabayashi | G02F 1/133512 349/57 |
| 2016/0127701 A1* | 5/2016 | Chern | H04N 9/3173 353/7 |
| 2016/0182794 A1* | 6/2016 | Aoki | H04N 5/243 348/229.1 |
| 2016/0238836 A1* | 8/2016 | Oganesian | G02B 27/005 |
| 2016/0353039 A1* | 12/2016 | Rephaeli | H04N 5/369 |
| 2017/0077163 A1* | 3/2017 | Chou | H01L 27/14627 |
| 2017/0077164 A1* | 3/2017 | Kawabata | H01L 27/14627 |
| 2017/0257554 A1* | 9/2017 | Huang | H01L 27/14621 |

OTHER PUBLICATIONS

Chen, Chien-Yu, et al.; "Analyses of optical out-coupling of organic lightemitting devices having micromesh indium tin oxide and conducting polymer as composite transparent electrode"; Optics Express; vol. 24, No. 10; Jan. 11, 2016; 13 pages.

* cited by examiner

DISPLAY DEVICE

CROSS-REFERENCE TO RELATED APPLICATION

This application claims priority to and the benefit of Korean Patent Application No. 10-2017-0040274 filed in the Korean Intellectual Property Office on Mar. 29, 2017, the entire contents of which are incorporated herein by reference.

BACKGROUND (a) Technical Field

The present disclosure relates to a display device, and more particularly, to a multi-view display device including a lens.

(b) Description of the Related Art

A three-dimensional (3D) image display device has attracted attention according to developments of display device techniques, and various 3D image display devices have been researched.

A three-dimensional image may be displayed using binocular disparity as a largest factor for recognizing three dimensions in the display technique of the 3D image. The 3D image display device may be classified into those using various methods, and may be largely classified into a stereoscopic 3D image display device and an autostereoscopic 3D image display device. In the case of the stereoscopic 3D image display device, there is a drawback that spectacles must be worn such that further development of the autostereoscopic 3D image display device is required.

The autostereoscopic 3D image display device may be classified into those using a multi-viewpoint method or a super multi-viewpoint method in which the 3D image may be observed without the spectacles in a specific viewing angle region, and an integrated image method, a volume image method, and a hologram method that provide the 3D image to be closer to actual 3D reality. Among them, the multi-viewpoint method may be classified into a spatial division method of spatially dividing an entire resolution to realize a required viewpoint number by using a lens array, and a temporal division method of temporally and quickly displaying several viewpoint images while maintaining the entire resolution. In the integrated image method, a basic image as an image in which 3D image information is photographed with a limited size in slightly different directions is stored and then is shown through a lens array, thereby allowing the 3D image to be recognized by the observer.

The autostereoscopic 3D image display device includes a photomodulation unit to control a path of light, and the lens array may be mainly used as the photomodulation unit.

The above information disclosed in this Background section is only for enhancement of understanding of the background of the present inventive concept and therefore it may contain information that does not form the prior art that is already known in this country to a person of ordinary skill in the art.

SUMMARY

Exemplary embodiments of this description have been made in an effort to provide a wide viewing angle multi-view display device capable of improving quality of side images viewed by observing the images displayed by the display device which can reproduce 3D images by using a lens array unit.

An exemplary embodiment of the present inventive concept provides a display device including: a display unit including a plurality of pixels; and a lens array unit including a plurality of lenses, wherein a first lens of the plurality of lenses corresponds to and overlaps two or more of the plurality of pixels, the two or more pixels include a first pixel and a second pixel, the first pixel is closer to an optical axis of the first lens than the second pixel is in a plan view, and a shortest distance between the first pixel and a reference is greater than a shortest distance between the reference surface and the second pixel, the reference surface being perpendicular to the optical axis of the first lens.

A shortest distance between the reference surface and the plurality of pixels may change regularly with a first period.

The first period may be substantially a same length as a pitch of the plurality of lenses.

In a plan view, a shortest distance between the reference surface and the two or more pixels corresponding to the first lens may decrease as a distance between the optical axis of the first lens and the two or more pixels increases.

The two or more pixels corresponding to the first lens may be disposed along a focal surface of the first lens.

When a surface through which the pixel emits light is referred to as a unit display surface, a direction in which the unit display surface of the first pixel is oriented may be different from a direction in which the unit display surface of the second pixel is oriented.

When a surface through which the pixel emits light is referred to as a unit display surface, a direction in which the unit display surface of the first pixel is oriented may be a same direction as a direction in which the unit display surface of the second pixel is oriented.

The display unit may include a first insulating layer, a plurality of thin layers positioned on the first insulating layer, and a plurality of light emitting diodes positioned on the plurality of thin layers, the plurality of thin layers include a transistor electrically connected to the light emitting diode, and a height of an upper surface of the first insulating layer corresponding to the first pixel is lower than a height of an upper surface of the first insulating layer corresponding to the second pixel.

The height of the upper surface of the first insulating layer may change regularly with a same period as the first period.

An upper surface of the first insulating layer corresponding to the first lens may form a single curved surface.

The upper surface of the first insulating layer may have a step-like shape.

The first insulating layer may include a plurality of insulating layers that are successively stacked, and a planar area of an opening included in at least two of the plurality of insulating layers increases closer to the lens array unit.

At least one of the plurality of insulating layers may have an opening corresponding to the optical axis of the first lens.

The display device may further include a substrate positioned below the first insulating layer, and an upper surface of the substrate may be substantially flat.

An exemplary embodiment of the present inventive concept provides a display device including: a display unit including a substrate and a plurality of pixels positioned on the substrate; a lens array unit including a plurality of lenses, and a height of the plurality of pixels based on a bottom surface of the substrate may change regularly with a first period, and the first period may be substantially a same length as a pitch of the plurality of lenses.

The plurality of pixels may include two or more pixels corresponding to one lens of the plurality of lenses, and a height of the two or more pixels based on the bottom surface of the substrate may increase as a distance from an optical axis of the one lens increases.

A height of an upper surface of the substrate may change regularly with a same period as the first period.

The display device may further include a first insulating layer positioned between the substrate and the plurality of pixels, and a height of an upper surface of the first insulating layer may change regularly with a same period as the first period.

An upper surface of the first insulating layer corresponding to one lens of the plurality of lenses may form a single curved surface.

An upper surface of the first insulating may layer have a step-like shape.

According to the exemplary embodiments of this description, it is possible to provide a wide viewing angle multi-view display device capable of improving quality of side images viewed by observing the images displayed by the display device which can reproduce 3D images by using a lens array unit.

DETAILED DESCRIPTION OF THE EMBODIMENTS

Figure 1:
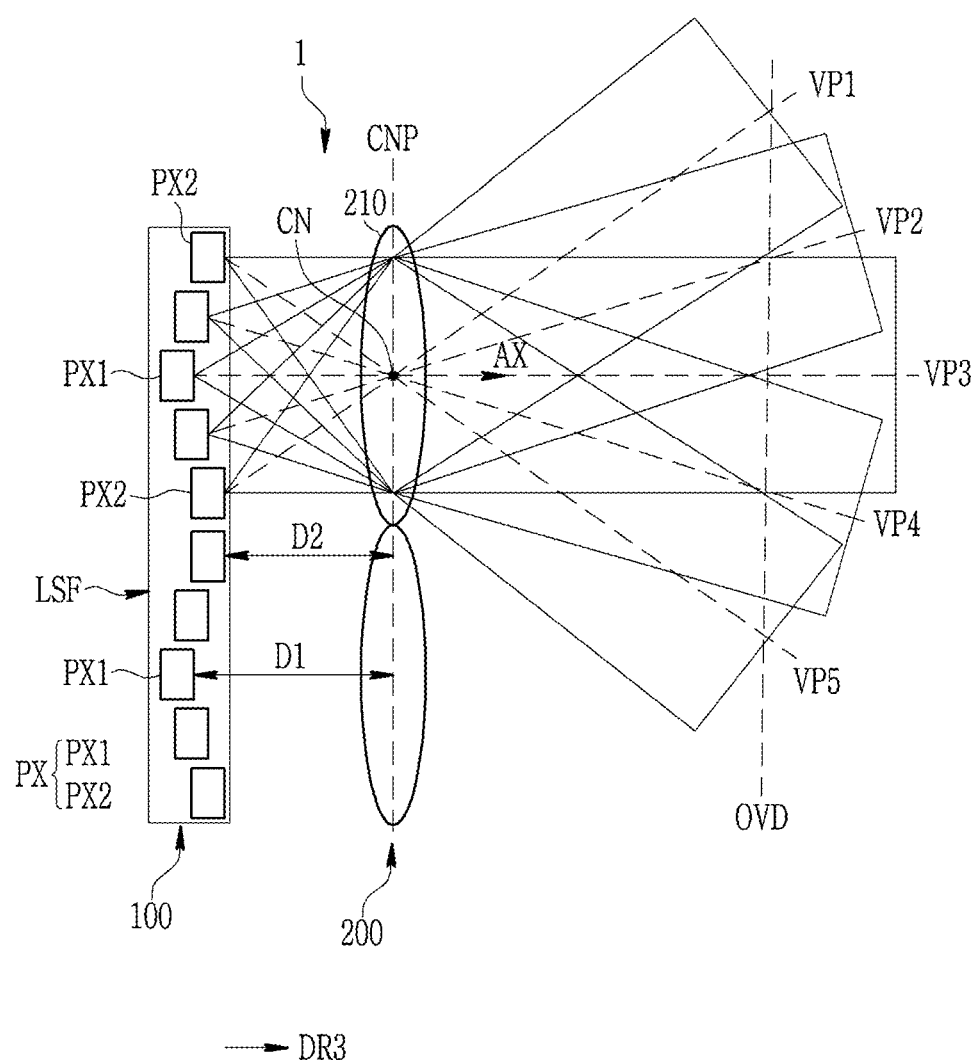
FIG. 1 illustrates a schematic cross-sectional structure of a display device according to an exemplary embodiment and a method for displaying a multi-view image.

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, but does not essentially mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Hereinafter, a display device according to an exemplary embodiment will be described with reference to FIG. 1 to FIG. 3.

First, referring to FIG. 1, the display device according to the present exemplary embodiment includes a display unit 100 including a plurality of pixels PX and a lens array unit 200 disposed at a side where the display unit 100 displays an image.

Each of the pixels PX, which are unit areas for displaying an image, may emit light of one of basic colors such as red, green, and blue depending on image information inputted from the display device 1.

The lens array unit 200 includes a plurality of lenses 210 which overlap the pixels PX of the display unit 100. Each of the lenses 210 may correspond to and overlap two or more pixels PX, i.e., a plurality of pixels PX, of the display unit 100. In the present description, the correspondence and overlapping of the two components may indicate a case that two components are overlapped with each other when viewed from either view (mainly a plan view). In addition, when a structure observed at a position where the pixels PX are arranged can be observed is described, an expression "in a plan view" is used.

Light of an image emitted from the display unit 100 passes through the lens array unit 200 as shown in FIG. 1 and may be observed at the observation position OVD where an optimized image can be observed. Images of a plurality of viewpoints VP1-VP5 can be observed in the observation position OVD, and different images may be observed at different viewpoints VP1-VP5. Accordingly, a three-dimensional image or a multi-view image can be observed. Each of the viewpoints VP1-VP5 may be a single point or a range of regions. Although five viewpoints VP1-VP5 are illustrated as an example in FIG. 1, the number of the viewpoints VP1-VP5 is not limited thereto.

Each pixel PX of the display unit 100 displays an image corresponding to one of the viewpoints VP1 to VP5, and the image displayed by each pixel PX passes through a corresponding lens 210. Light of the pixels PX corresponding to each lens 210 may be refracted in different directions through the lenses 210 depending on positions of the pixels PX. Accordingly, the light of the pixels PX corresponding to the respective lenses 210 may be transferred through different optical paths to be observed at the corresponding viewpoints VP1-VP5. The pixels PX corresponding to the respective lenses 210 can display images of substantially all viewpoints VP1-VP5 together. Each of the left and right eyes of an observer can perceive the images of different viewpoints VP1-VP5 to feel depth or a stereoscopic effect of the images.

According to the exemplary embodiment, a height (or a shortest distance) of the pixels PX with respect to one reference surface may not be constant, and may be regularly changed with a period. Herein, the reference surface may be a virtual plane or a real plane as a plane on which a distance to the pixels can have periodicity. Hereinafter, a plane that can be set by the lens array unit 200 and a plane that can be set by the display unit 100 will be described as an example of such a reference surface. In addition, hereinafter, 'distance' indicates a shortest distance unless otherwise stated.

As illustrated in FIG. 1, for one lens 210, a distance between the reference surface perpendicular to an optical axis AX (which may be a straight line) of the lens 210 and the pixels PX corresponding to the corresponding lens 210 is not constant. The reference surface may include a plurality of reference surfaces, but when a surface that is perpendicular to the optical axis AX of a lens 210 while extending a center CN (which is a center in a cross-sectional view) is referred to as a central surface CNP of the lens 210, the central surface CNP may be determined as the reference surface. As a result, a distance between the center plane CNP of one lens 210 and the pixels PX corresponding to the lens 210 is not constant with respect to the lens 210. Hereinafter, the central surface CNP will be described as a major example of the reference surface. Meanwhile, the optical axis AX may extend through the center CN of the lens 210.

For a first pixel PX1 and a second pixel PX2 of the pixels PX corresponding to one lens 210, a distance D1 between the first pixel PX1 and the central surface CNP of the lens 210 may be different from a distance between the second pixel PX2 and the central surface CNP of the lens 210. Specifically, for one lens 210, when the first pixel PX1 is positioned closer to the center CN or the optical axis AX of the lens 210 in a plan view as compared to the second pixel PX2, the distance D2 may be smaller than the distance D1.

Furthermore, for one lens 210, when the first pixel PX1 is a pixel that is disposed on the optical axis AX or the center CN in the plan view or is positioned closest to the optical axis AX or the center CN in the plan view and the second pixel PX2 is positioned farthest from the optical axis AX or the center CN than the first pixel PX1 in the plan view, the distance D2 from the central surface CNP of the first pixel PX1 among the two or more pixels PX corresponding to one lens 210 may be the maximum, and the distance D1 from the central surface CNP of the second pixel PX2 may be the minimum. As a result, the second pixel PX2 among the pixels PX corresponding to one lens 210 may be a pixel that is closest to the central surface CNP of the lens 210, and the first pixel PX1 may be a pixel that is farthest from the central surface CNP of the lens 210.

In the plan view, as the distance from the optical axis AX of the lens 210 increases, a distance between the pixel PX and the central surface CNP of the lens 210 may gradually change, and more particularly, may be gradually reduced. As a result, a distance between the pixels PX corresponding to one lens 210 and the central surface CNP of the lens 210 may increase close to the center CN or the optical axis AX of the lens 210 in the plan view, and may decrease farthest from the center CN or the optical axis AX of the lens 210 in the plan view.

When the first pixel PX1 is a pixel that is disposed substantially on the center CN or the optical axis AX of the lens 210 in the plan view, the distance D1 between the first pixel PX1 and the central surface CNP of the lens 210 may be the same as a focal distance of the lens 210.

For one lens 210, the distance between the pixel PX and the central surface CNP of the lens 210 may change moving from one pixel PX to another pixel PX, or may change moving from one pixel PX across two or more pixels PX. That is, with regard to a lens 210, distances from the central surface CNP to two adjacent pixels PX may be the same as each other for those two adjacent pixels PX, or they may be different for those two adjacent pixels PX.

A cross-section disposal relationship of the pixels PX will be described based on the display unit 100.

Referring to FIG. 1, when an opposite surface to a display surface of the display unit 100 is referred to as a bottom surface LSF, the bottom surface LSF may be a bottom surface of a substrate included in the display unit 100, which may be substantially flat, or may form a single curved surface generally with respect to the lenses 210. Forming the single curved surface indicates that the bottom surface LSF is constantly concave or convex. When the bottom surface LSF is substantially flat, the bottom surface LSF may be substantially perpendicular to the optical axis AX of the lens 210.

A distance between the pixels PX corresponding to one lens 210 and the bottom surface LSF, i.e., a height of the pixels PX based on the bottom surface LSF, may not be constant, and may change regularly with a period.

Specifically, a distance between the first pixel PX1 among the pixels PX corresponding to one lens 210 and the bottom surface LSF may be different from a distance between the second pixel PX2 and the bottom surface LSF. For one lens 210, when the first pixel PX1 is positioned closer to the center CN or the optical axis AX of the lens 210 than the second pixel PX2, the distance between the second pixel PX2 and the bottom surface LSF may be greater than the distance between the first pixel PX1 and the bottom surface.

Furthermore, for one lens 210, when the first pixel PX1 is a pixel that is disposed on the optical axis AX or the center CN in the plan view or is positioned closest to the optical axis AX or the center CN in the plan view and the second pixel PX2 is positioned farthest from the optical axis AX or the center CN than the first pixel PX1 in the plan view, a distance between the first pixel PX1 among the two or more pixels PX corresponding to one lens 210 and the bottom surface LSF may be a minimum, and a distance between the second pixel PX2 and the bottom surface LSF may be the maximum.

In the plan view, as the distance from the optical axis AX of the lens 210 increases, a distance between the cross-sectional pixel PX and the bottom surface LSF may gradually change, and more particularly, may be gradually increased. As a result, the distance between the pixels PX corresponding to one lens 210 and the bottom surface LSF, i.e., a height of the pixels PX based on the bottom surface LSF, may decrease closer to the center CN or the optical axis AX of the lens 210 in the plan view, and may increase farther from the center CN or the optical axis AX of the lens 210 in the plan view.

In the plan view, the first pixel PX1 disposed on the center CN or the optical axis AX of the lens 210 or positioned closest thereto may include a single first pixel or a plurality of first pixels for each lens 210.

For example, when the pixels positioned closest to the optical axis AX of the lens 210 are more than one and have a same distance to the optical axis AX, the first pixel PX1 may include a plurality of pixels for one lens 210.

Figure 2:
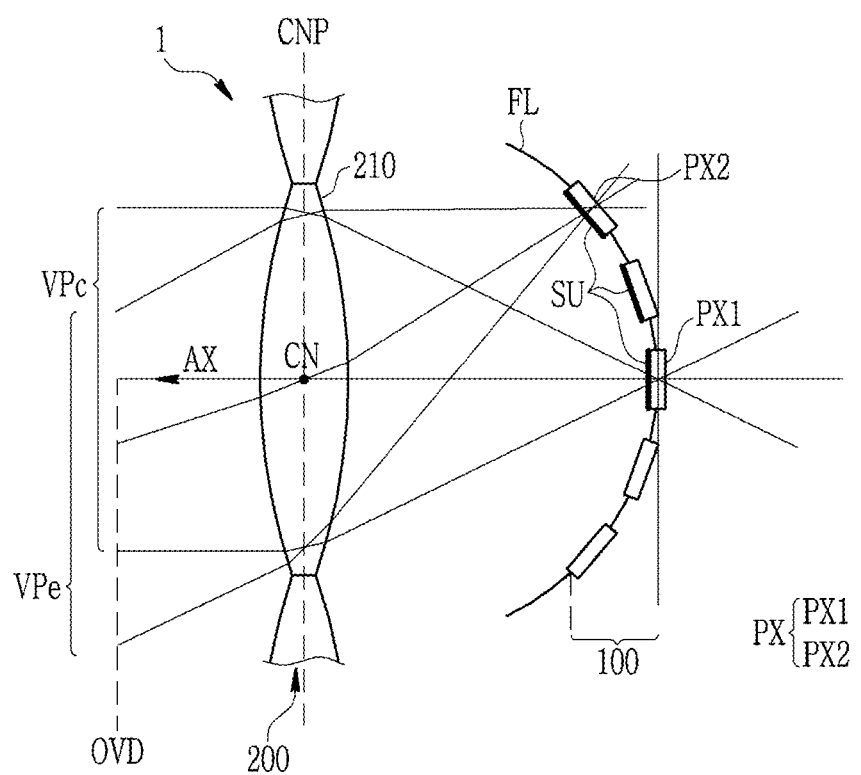
FIG. 2, FIG. 3, and FIG. 4 illustrate a planar disposal relationship between pixels and a lens array unit of a display device according to an exemplary embodiment.
Figure 3:
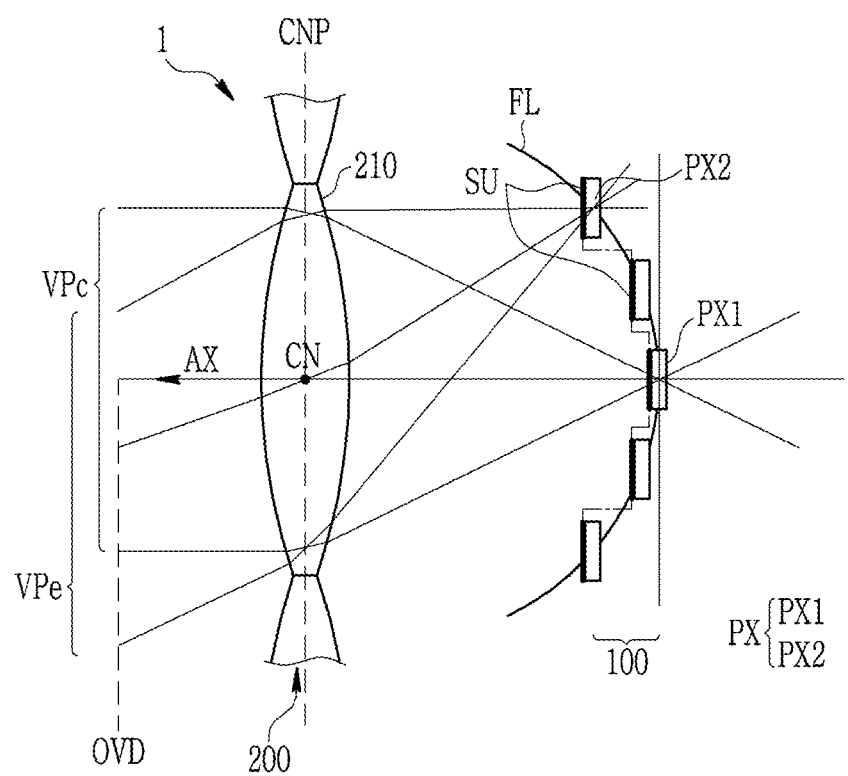

Referring to FIG. 2 and FIG. 3, when a surface through which light is emitted from the respective pixels of the display unit 100 is referred to as a unit display surface SU and a virtual surface connecting unit display surfaces SU of the pixels PX corresponding to one lens 210 is referred to as a display surface, the slope and shape of the unit display surfaces SU may vary.

Referring to FIG. 2, a direction in which the unit display surface SU of the pixels PX corresponding to one lens 210 (or, a direction of a normal line) may change depending on positions. Specifically, in the plan view, a unit display surface SU of the first pixel PX1 disposed on the center CN or the optical axis AX of the lens 210 or positioned closest thereto may substantially face the center CN of the lens 210, and a unit display surface SU of the second pixel PX2 positioned farther from the center CN or the optical axis AX of the lens 210 than the first pixel PX1 may form an angle that is greater than 0 together with the unit display surface of the first pixel PX1. In addition, unit display surfaces SU of the pixels PX corresponding to one lens 210 may substantially face the center CN of the lens 210. Accordingly, the virtual display surface connecting the unit display surfaces SU may substantially form a single curved surface, and may particularly form a concave surface facing the center CN of the lens 210.

When a surface constituted by focal points on which light traveling in parallel with the optical axis AX of the lens 210 and light traveling away from the optical axis AX (forming an angle that is greater than 0 together with the optical axis AX) is referred to as a focal surface FL, the focal surface FL may form a curved surface instead of being flat as shown in FIG. 2. According to an exemplary embodiment, the two or more pixels PX corresponding to one lens 210 may be disposed substantially along the focal surface FL. For example, when a pixel PX corresponding to a front viewpoint VPc as a front view is the first pixel PX1, the first pixel PX1 may be positioned on the focal surface FL, and when a pixel PX corresponding to a side viewpoint VPe as a side view is the second pixel PX2, the second pixel PX2 may also be positioned in or at least close to the focal surface FL. A distance between the center CN of the lens 210 and the first pixel PX1 may be a focal distance of the lens 210.

The aforementioned virtual display surface connecting the unit display surfaces SU may be bent along the focal surface FL, and the display surface may substantially coincide with the focal surface FL.

A phenomenon that a focal position approaches the lens 210 as light passing through the lens 210 travels away from the optical axis AX is referred to as field curvature or Petzval field curvature. In the case that the pixels PX of the display unit 100 are disposed on a planar surface of a constant height, the pixels PX positioned far from the optical axis AX of the lens 210 may not be clearly visible when observed at the observation position OVD. As a result, when being viewed from the side viewpoint VPe, images of adjacent pixels PX or a non-emission portion (e.g., a light blocking member or a pixel definition layer) as well as images of corresponding pixels PX may be overlapped with each other, thereby generating image quality deterioration such as crosstalk, moiré, color deviation, reduction in brightness, image distortion, etc.

However, according to the present exemplary embodiment, the pixels PX corresponding to one lens 210 are not disposed on the planar surface, are disposed to have different distances with the central surface CNP of the lens 210, and are disposed along or at least close to the focal surface FL, and thus such field curvature phenomenon may be compensated. In addition, even when images are observed at a side thereof the image quality deterioration such as crosstalk, moiré, color deviation, reduction in brightness, image distortion, etc., may not occur. Accordingly, it is possible to implement the wide viewing angle multi-view display device by reducing the image quality deterioration which may be observed in the side image. This will be described in detail later by using a comparative example.

Referring to FIG. 3, the display device 1 according to the present exemplary embodiment is the same as most of the aforementioned exemplary embodiment illustrated in FIG. 2. However, the direction in which the unit display surface SU of the pixels PX corresponding to one lens 210 faces (or, the direction of the normal line) may be substantially constant. Accordingly, the virtual display surface connecting the unit display surfaces SU may form a step-like surface as indicated by a step-like dotted line in FIG. 3, and the step-like surface may be generally bent toward the center CN of the lens 210 to approach the central surface CNP of the lens 210 as the distance from the center CN of the lens 210 increases.

The unit display surfaces SU of the pixels PX corresponding to one lens 210 may be in parallel with the reference surface, e.g., the central surface CNP perpendicular to the optical axis AX of the lens 210.

Hereinabove, the relationship between one lens 210 and the pixels PX corresponding thereto has been described. Hereinafter, the lenses 210 and the pixels PX will be described in detail with reference to FIG. 4 to FIG. 9 together with FIG. 1 to FIG. 3.

Figure 4:
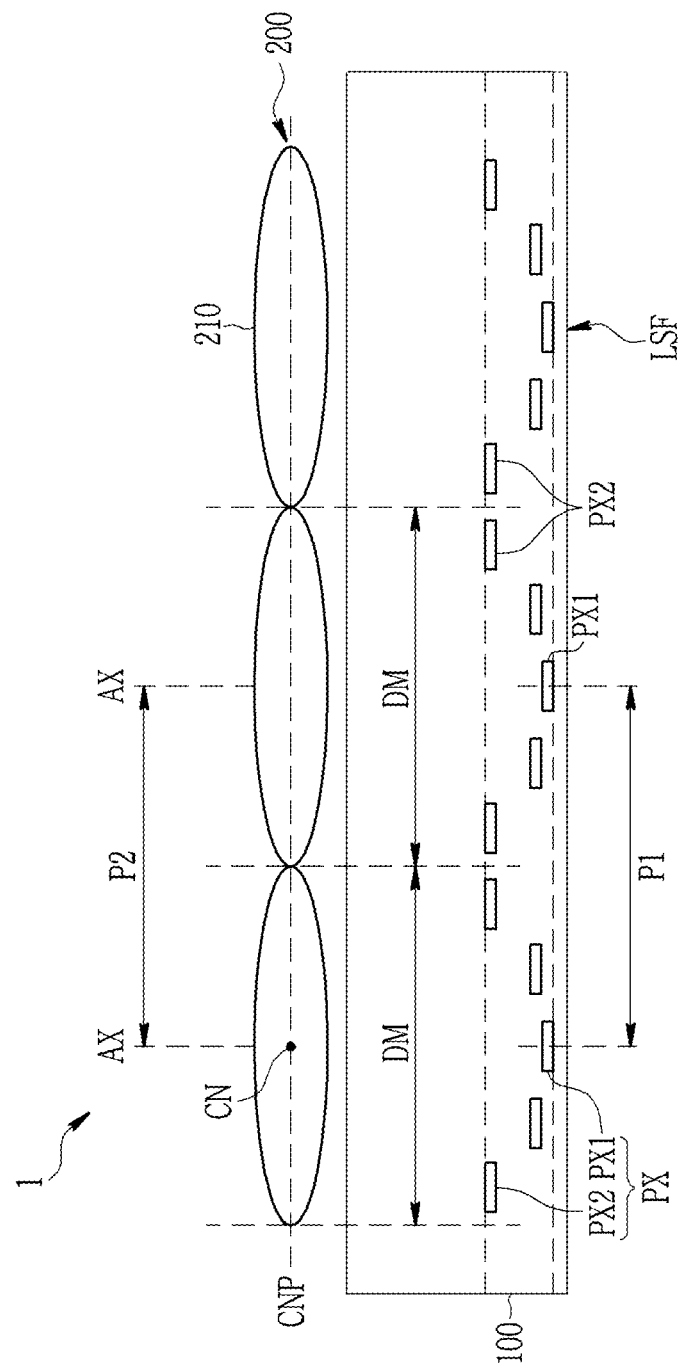

Referring to FIG. 4, the display device 1 according to an exemplary embodiment may have almost the same features as those described above. As described above, in a plan view, the pixels PX positioned to correspond to one lens 210 may be positioned at different distances (or different heights) from the central surface CNP of the lens 210 depending on the distance from the optical axis AX or the center CN of the lens 210.

For the plurality of lenses 210, distances between the pixels PX and the central surface CNP of the lenses 210, i.e., a height of the pixels PX with respect to the central surface CNP as the reference surface, may change regularly with a period. As a result, the change in the distance between the pixels PX and the central surface CNP of the lenses 210 may be repeated by a unit of the lens 210.

A height variation period P1 which is a period of change in the distance between the central surface CNP of the lenses 210 and the pixels PX, or the height variation period P1 of the pixels PX based on the bottom surface LSF of the display unit 100, may be the same as a pitch P2 of at least two adjacent lenses 210. The pitch P2 of the lenses 210 may be represented by, for example, a distance between boundaries between two adjacent lenses 210 or a distance between the centers CN of the adjacent lenses 210. The height variation period P1 of the pixels PX may be represented by a distance between two adjacent first pixels PX1 among the pixels (e.g., the first pixels PX1) positioned farthest from the central surface CNP of the lenses 210.

The lenses 210 according to an exemplary embodiment may be microlenses or lenticular lenses. When the lenses 210 are the lenticular lenses, the optical axes AX of the lenses 210 may form an optical axis surface, and the centers CN of the lenses 210 may form central lines included in the optical axis surface. In the description, the optical axis AX includes an optical axis surface, and the center CN includes a center line.

The lens array unit 200 may be a lens sheet in which a plurality of lenses are arranged in a plan view, or a lens array formed in a mode by optical modulation unit (e.g., a liquid crystal lens) which can be switched, such as a liquid crystal layer.

The lens array unit may be disposed on the display unit 100 as a thin layer by using a same process as the manufacturing process of the display unit 100. Alternatively, the second lens array unit 200 may be manufactured as a separate panel, and then may be attached to the display unit 100 by using an adhesive member.

The lens array unit 200 may be divided into a plurality of domains DM in a plan view, and one lens 210 may be correspondingly positioned in each of the domains DM.

Figure 5:
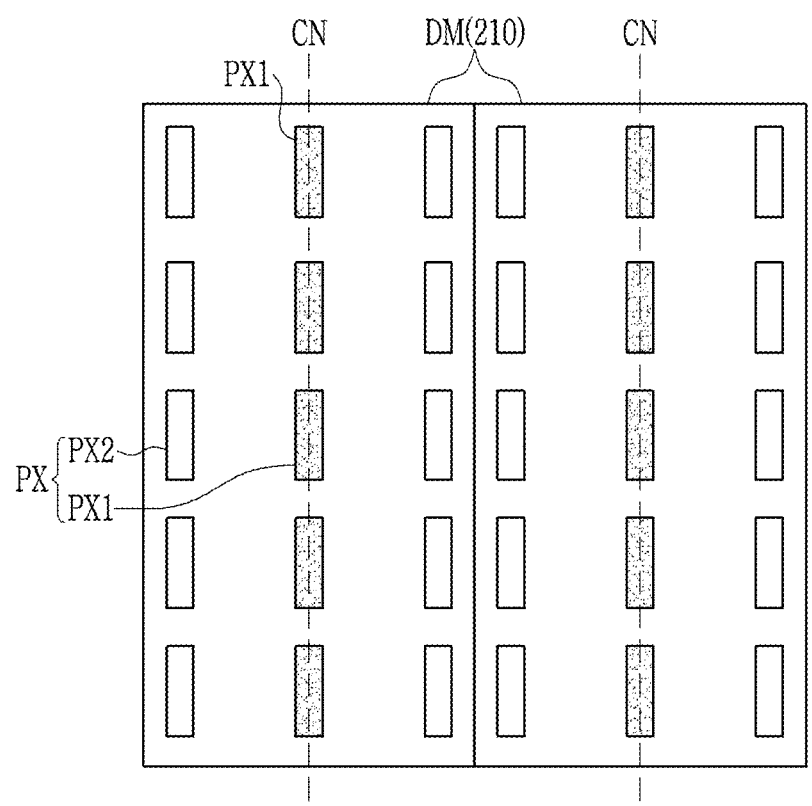
FIG. 5, FIG. 6, and FIG. 7 illustrate a planar disposal relationship between a plurality of pixels and a lens array unit of a display device according to an exemplary embodiment.
Figure 6:
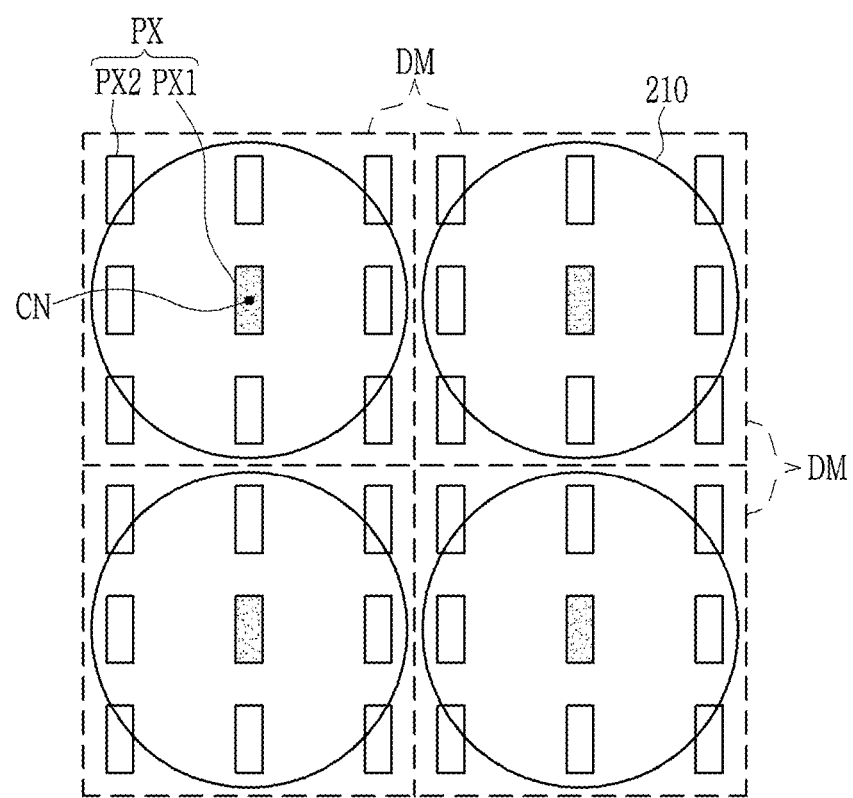
Figure 7:
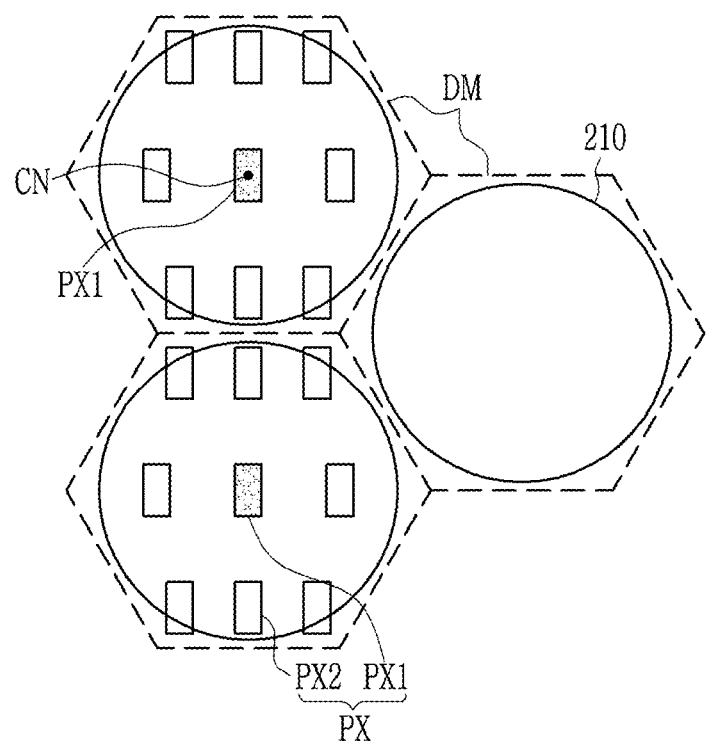

Herein, referring to FIG. 5 to FIG. 7, a shape of the domains DM may be one of various polygons. FIG. 5 and FIG. 6 illustrate quadrangular domains DM as examples, and FIG. 7 illustrates hexagonal domains DM as an example.

A distance variation pattern of the pixels PX to the central surface CNP of the lens 210 or a height variation pattern of the pixels PX based on the bottom surface LSF of the display unit 100 may be the same as a disposal pattern of the lenses 210 included in the lens array unit 200 or a disposal pattern of the domains DM of the lenses 210. As a result, the height variation pattern of the pixels PX may be repeated by a unit of the lens 210.

For example, referring to FIG. 5, when each of the domains DM has a rectangular shape that extends in a direction, the lens 210 corresponding to each domain DM may be a lenticular lens, the pixel PX that corresponds to or is closest to the center CN (or may be a central line) of each lens 210 may be the first pixel PX1 as described above, and the pixel PX positioned far from the center CN as compared with the first pixel PX1 may be the second pixel PX2 as described above. A disposal pattern of the pixels PX including the first pixel PX1 and the second pixel PX2 may be repeated in a direction (e.g., a horizontal direction) like the disposal pattern of the domains DM or the lenses 210, and the repetition periods may be the same.

As another example, referring to FIG. 6 and FIG. 7, when each domain DM is a symmetrical polygon (may be a regular polygon) also in directions (e.g., a diagonal direction) other than horizontal and vertical directions, the lens 210 corresponding to each domain DM may be a microlens, and a planar shape of each lens 210 may be substantially circular. The present inventive concept is not limited thereto. FIG. 6 illustrates square domains DM as an example, and FIG. 7 illustrates hexagonal domains DM as an example. As described above, the pixel PX that corresponds to or is closest to the center CN of each lens 210 may be the first pixel PX1, and the pixel PX positioned farther from the center CN as compared with the first pixel PX1 may be the second pixel PX2. A disposal pattern of the pixels PX including the first pixel PX1 and the second pixel PX2 may be repeated in at least two directions (e.g., a horizontal direction and a vertical direction) like the disposal pattern of the domains DM or the lenses 210, and the repetition periods may be the same.

A planar disposal structure of the display device 1 according to an exemplary embodiment will be described in detail with reference to FIG. 8 and FIG. 9 together with FIG. 4 to FIG. 7.

Figure 8:
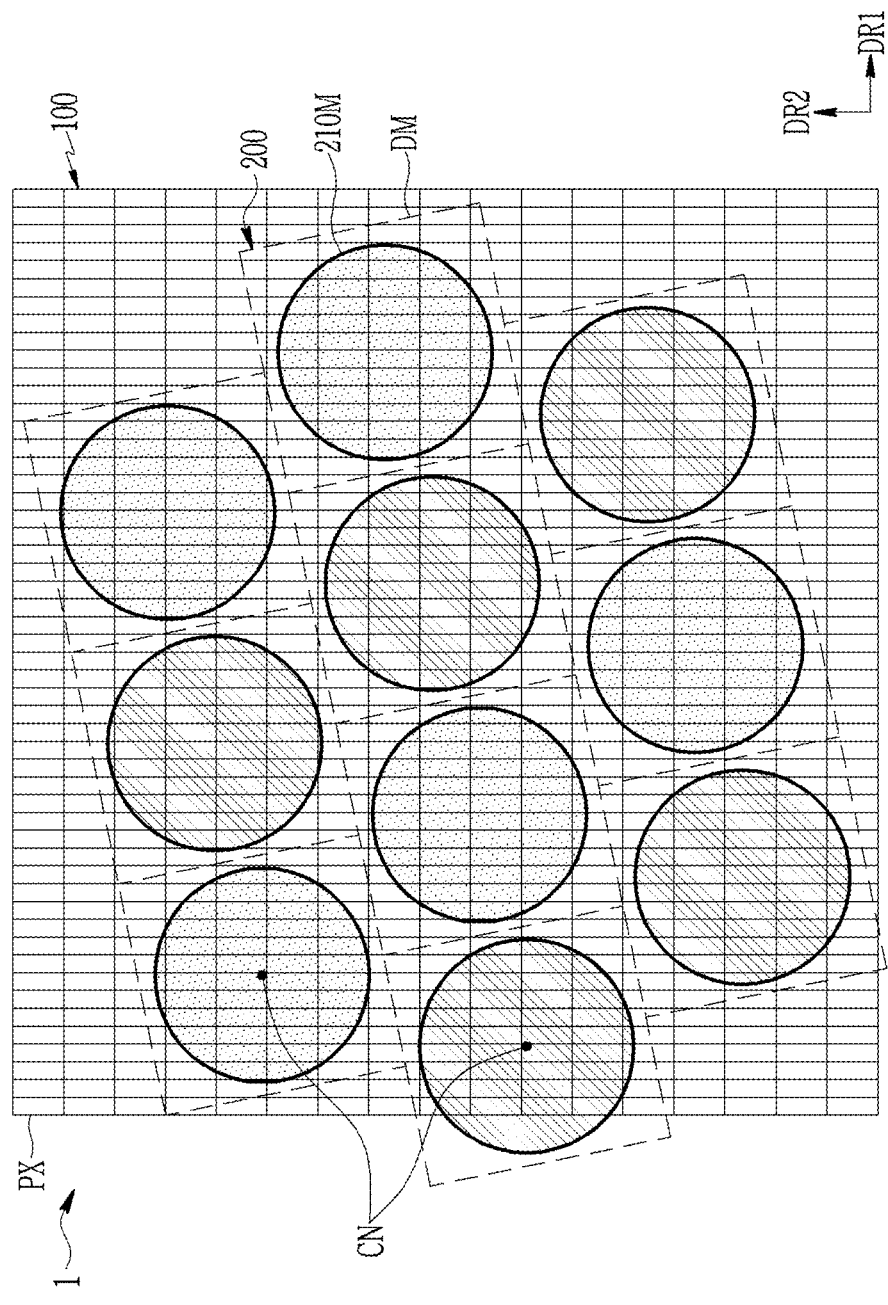
FIG. 8 and FIG. 9 illustrate a planar disposal relationship between a display unit and a lens array unit of a display device according to an exemplary embodiment.

Referring to FIG. 8, a lens array unit 200 according to the present exemplary embodiment may be divided into a plurality of domains DM, and one microlens 210M may be positioned in each of the domains DM. FIG. 8 illustrates square domains DM as an example. Each of the domains DM overlaps two or more pixels PX, and light emitted from the pixels PX corresponding to the respective domains DM may be refracted in different directions depending on a position of the microlens 210M disposed in each of the domains DM so that images in each of the pixels PX can be visible at different viewpoints. The shape and disposal of the domains DM may be variously modified without being limited to that shown therein.

The pixels PX of the display unit 100 may be arranged in a substantially matrix form along a first direction DR1 and a second direction DR2, and the domains DM or the microlenses 210M of the first lens array unit 300 may be arranged in an obliquely inclined direction with respect to the first direction DR1 and the second direction DR2 as illustrated therein. Alternatively, the domains DM or the microlenses 210M may be arranged in a direction that is substantially in parallel with the second direction DR2.

For each domain DM, as described above, the pixel that corresponds to or is closest to the center CN of the microlens 210M may be the first pixel PX1, and the pixel PX positioned farther from the center CN of the microlens 210M as compared with the first pixel PX1 may be the second pixel PX2.

Figure 9:
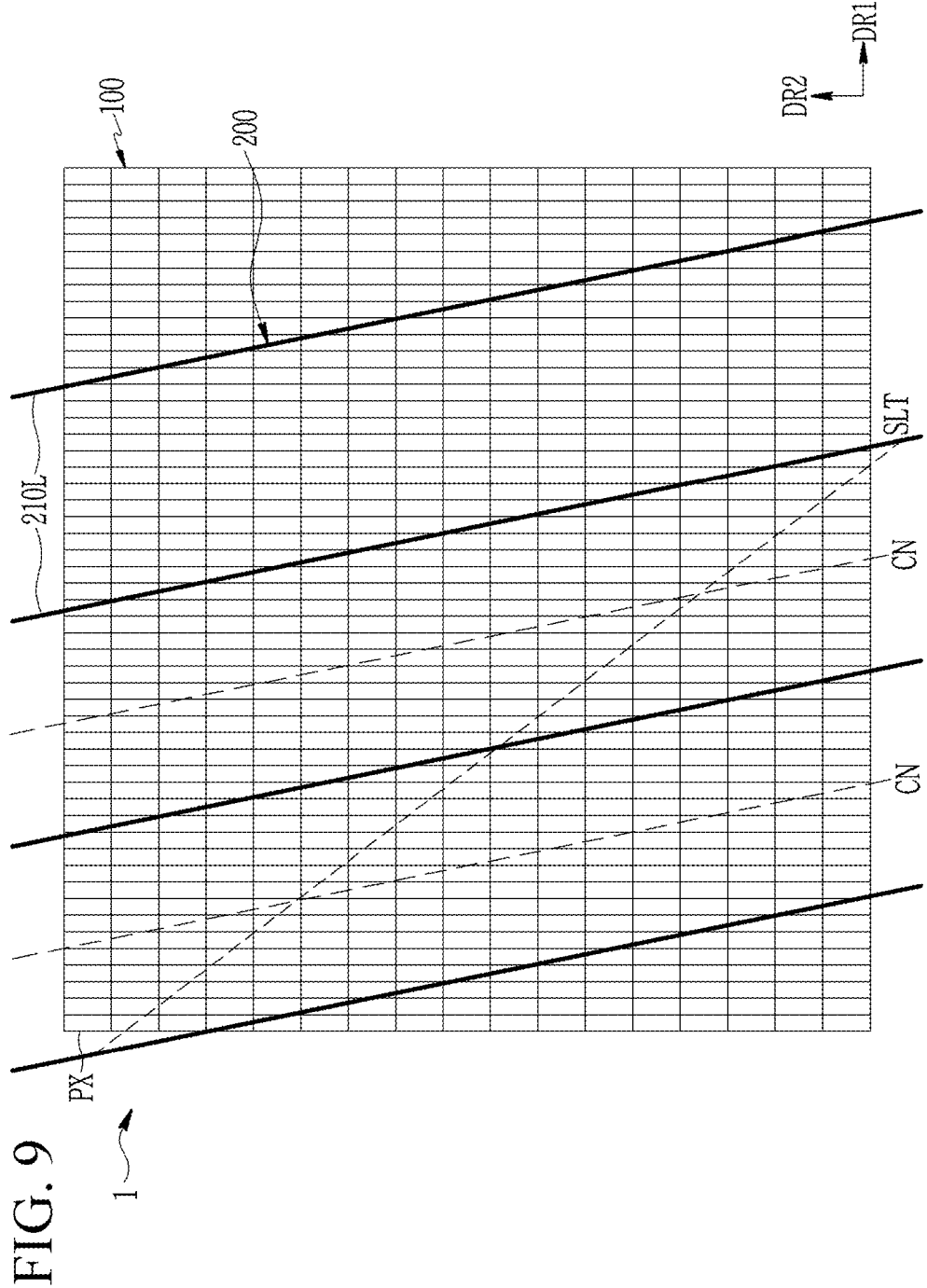

Next, referring to FIG. 9, the present exemplary embodiment is the same as most of the aforementioned exemplary embodiment of FIG. 8. However, the lens array unit 200 may include a plurality of lenticular lenses 210L. Each of the lenticular lenses 210L, as illustrated therein, may extend in a direction that is obliquely inclined with reference to the first direction DR1 and the second direction DR2. Alternatively, the extending direction of the lenticular lenses 210L may be substantially in parallel with the second direction DR2. As described above, the pixel PX that corresponds to or is closest to the center CN (or may be a central line) of each lenticular lens 210L may be the first pixel PX1 as described above, and the pixel PX positioned farther from the center CN as compared with the first pixel PX1 may be the second pixel PX2.

A cross-sectional structure of a display device according to an exemplary embodiment will be described with reference to FIG. 10 to FIG. 16 together with FIG. 1 to FIG. 9. The same constituent elements as in the exemplary embodiments described above are designated by the same reference numerals, and duplicated description is omitted.

Figure 10:
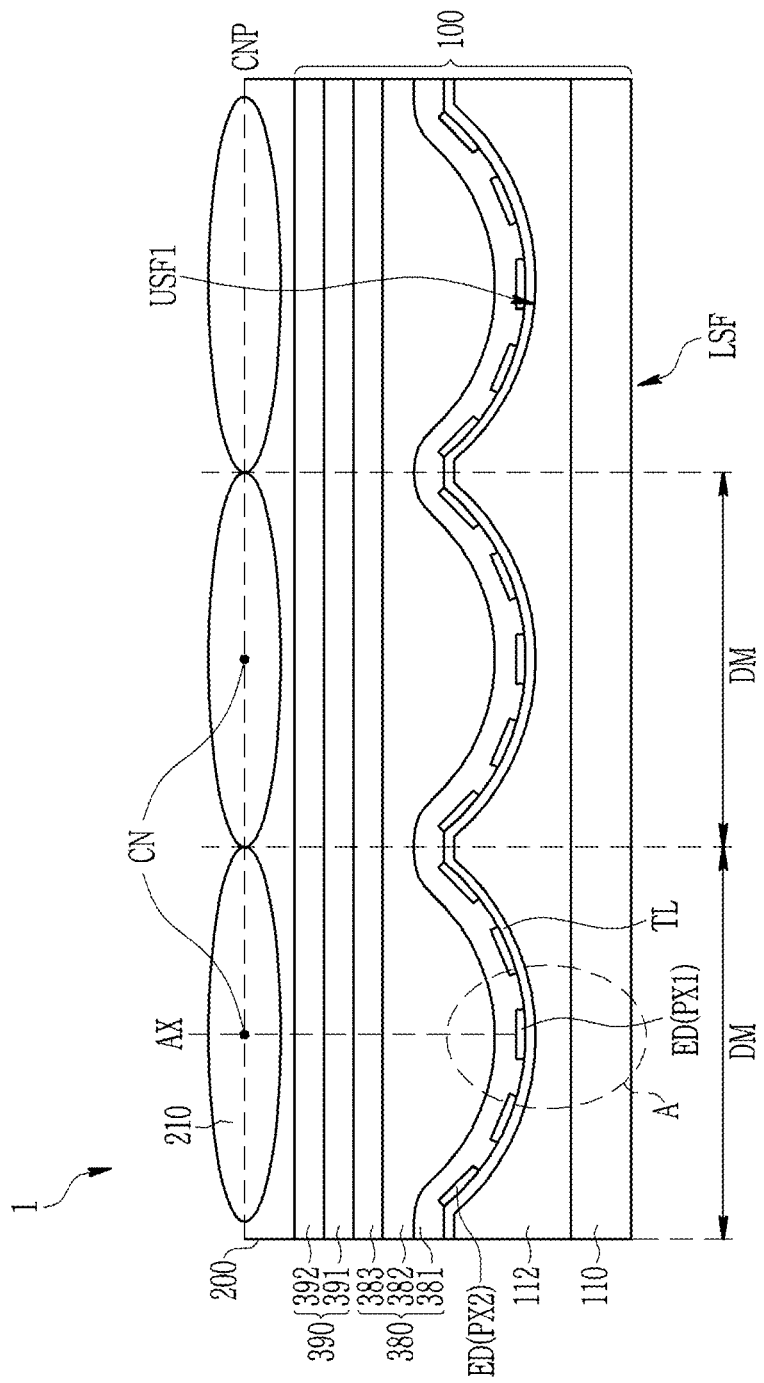
FIG. 10 is a cross-sectional view illustrating a display device according to an exemplary embodiment.
Figure 11:
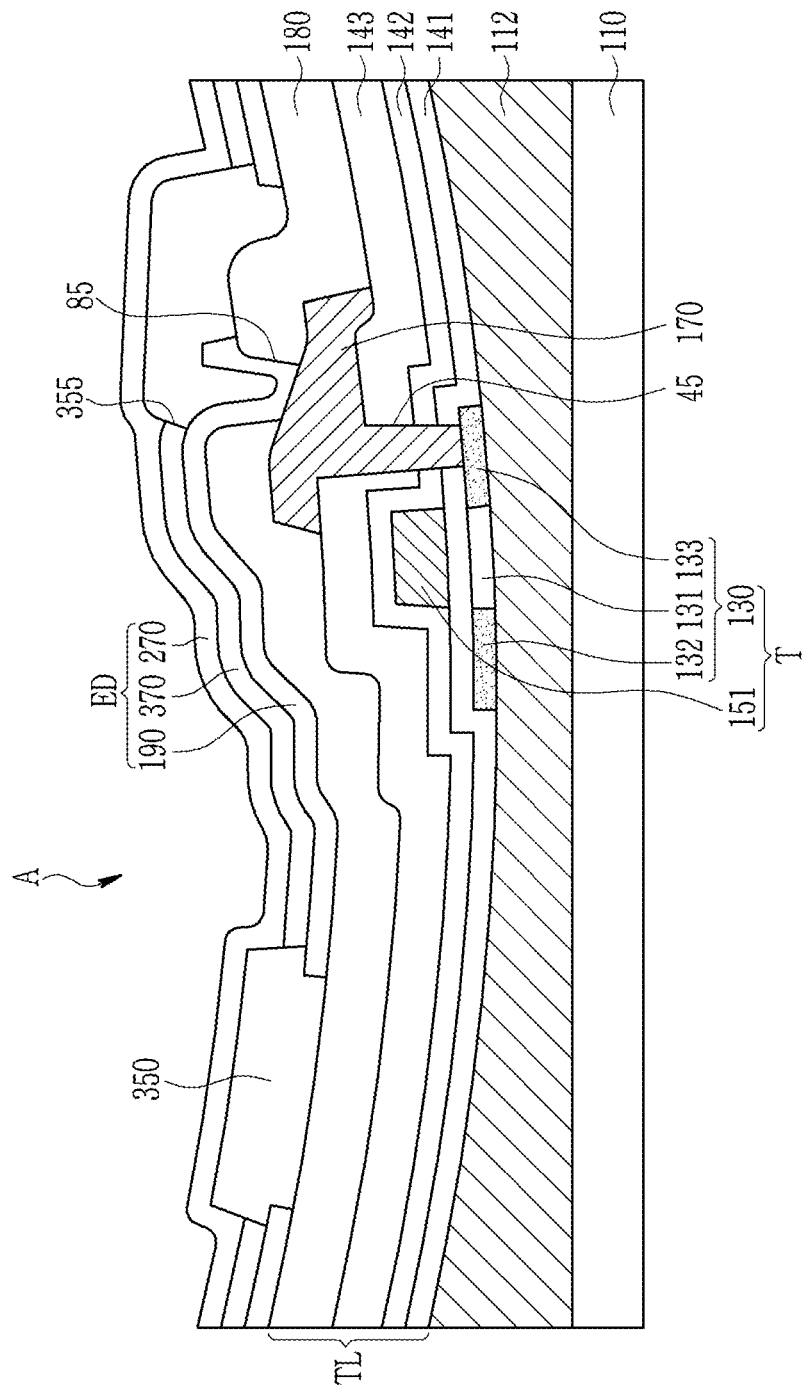
FIG. 11 is a cross-sectional view illustrating an area "A" of the display device of FIG. 10.

First, referring to FIG. 10 and FIG. 11, the display device 1 according to an exemplary embodiment includes a display unit 100 and a lens array unit 200, and the lens array unit 200 includes a plurality of lenses 210.

The display unit 100 may include an insulating substrate 110. The substrate 110 may be referred to as an insulating layer. An upper surface of the substrate 110 may be substantially flat, but the present inventive concept is not limited thereto.

A first insulating layer 112 may be disposed on the substrate 110. As described above, the first insulating layer 112 may serve as a height correction layer for changing a height of the pixels PX based on the bottom surface LSF of the display unit 100 or the central surface CNP of the lens 210, and may include an organic material such as a resin.

A height of an upper surface USF1 of the first insulating layer 112 changes periodically, and the period may be the same as the pitch of the lens 210. Specifically, a highest portion of the upper surface USF1 of the first insulating layer 112 may correspond to a boundary with the adjacent lens 210, and a lowest portion thereof may correspond to the center CN of the corresponding lens 210. A distance in a thickness direction between the highest portion and the lowest portion of the upper surface USF1 of the first insulating layer 112 may be approximately several micrometers or more.

Referring to FIG. 10, the upper surface USF1 of the first insulating layer 112 corresponding to one lens 210 may form a substantially smooth single surface (specifically, a single concave surface), but the present inventive concept is not limited thereto.

Although FIG. 10 illustrates an example in which the first insulating layer 112 is continuously formed on the substrate 110, the present inventive concept is not limited thereto. A portion of the first insulating layer 112 corresponding to the center CN of the lens 210 may be completely removed.

This first insulating layer 112 may be formed using various methods known to those of ordinary skill in the art. For example, the first insulating layer 112 may be formed using a molding process or may be formed using a photolithography process using a mask having a plurality of levels of transmittance.

A plurality of thin layers TL may be disposed on the first insulating layer 112.

Referring to FIG. 11, the thin layers TL may include an active pattern 130 disposed on the first insulating layer 112. The active pattern 130 may be formed of a semiconductor material such as amorphous/polycrystalline silicon or an oxide semiconductor, and may include a channel region 131 and conductive regions 132 and 133. The conductive regions 132 and 133 have a higher carrier concentration than a carrier concentration of the channel region 131.

A second insulating layer 141 may be disposed on the active pattern 130. A plurality of first conductive layers including a gate electrode 151 may be disposed on the second insulating layer 141. The gate electrode 151 may form one transistor T together with the conductive regions 132 and 133 positioned on opposite sides of the channel region 131 and the channel region 131 of the active pattern 130. The pair of conductive regions 132 and 133 positioned on opposite sides of the channel region 131 may be a source region and a drain region of the transistor T, respectively.

A third insulating layer 142 and a fourth insulating layer 143 may be disposed on the first conductive layer and the second insulating layer 141. A second conductive layer may be further disposed between the third insulating layer 142 and the fourth insulating layer 143. The second conductive layer may be omitted, and the third insulating layer 142 may be omitted as well. The second to fourth insulating layers 141, 142, and 143 may include contact holes 45 positioned above the conductive region 133 of the transistor T.

A third conductive layer including a connecting member 170 may be disposed on the fourth insulating layer 143. The connecting member 170 may be electrically connected to the conductive region 133 of the transistor T through the contact hole 45.

At least one of the first conductive layer, the second conductive layer, and the third conductive layer is formed of a conductive material such as copper (Cu), aluminum (Al), molybdenum (Mo), titanium (Ti), tantalum (Ta), or an alloy of at least two thereof.

A passivation layer 180 may be disposed on the third conductive layer and the fourth insulating layer 143. The passivation layer 180 may include a contact hole 85 positioned on the connecting member 170.

At least one of the second insulating layer 141, the third insulating layer 142, the fourth insulating layer 143, and the passivation layer 180 may include an inorganic insulating material such as a silicon nitride, a silicon oxide, and/or an organic insulating material. For the second insulating layer 141, the third insulating layer 142, the fourth insulating layer 143, and the passivation layer 180, a curved-surface shape of the upper surface USF1 of the first insulating layer 112 may be transferred as it is, such that an upper surface of the passivation layer 180 may have a curved-surface shape corresponding to the curved-surface shape of the first insulating layer 112. To that end, the second insulating layer 141, the third insulating layer 142, the fourth insulating layer 143, and the passivation layer 180 may have an appropriate thickness and material.

The layers from the active pattern 130 to the passivation layer 180 may be included in the thin layers TL.

A fourth conductive layer including a plurality of pixel electrodes 190 may be disposed on the passivation layer 180 or the thin layers TL. Each of the pixel electrodes 190 may be connected with the connecting member 170 through the contact hole 85 to receive a voltage.

A pixel defining layer (PDL) 350 may be disposed on the passivation layer 180 and the pixel electrode 190. The pixel defining layer 350 may have an opening 355 positioned on each of the pixel electrodes 190.

An emission layer 370 is positioned on the pixel electrodes 190. The emission layer 370 may be positioned in the opening 355 of the pixel defining layer 350. The emission layer 370 may include an organic light emitting material or an inorganic light emitting material.

A common electrode 270 is positioned on the emission layer 370. The common electrode 270 may also be formed on the pixel defining layer 350 to extend over the pixels.

The pixel electrode 190, the emission layer 370, and the common electrode 270 together form a light emitting diode ED. The light emitting diode ED substantially corresponds to the pixel PX described above, and each light emitting diode ED may be an element included in each pixel PX to emit light.

Referring to FIG. 10, as described above, the light emitting diode ED corresponding to the lowest portion of the upper surface USF1 of the first insulating layer 112 may correspond to the first pixel PX1, and the light emitting diode ED of another pixel positioned around the first pixel PX1 may correspond to the second pixel PX2. As described above, an upper surface of the passivation layer 180 has a curved-surface shape corresponding to a shape of the curved surface (repeated concave surface) of the upper surface USF1 of the first insulating layer 112. Accordingly, in a plan view, a distance between the light emitting diode ED and the center plane CNP of the lens 210 may become smaller as the distance from the center CN of the lens 210 increases. Therefore, even when images are observed at a side thereof, the image quality deterioration such as crosstalk, moiré, color deviation, reduction in brightness, image distortion, etc., may be prevented to realize a wide viewing angle multi-view display device.

Re-referring to FIG. 10, an encapsulation layer 380 for protecting the light emitting diode ED may be further disposed on the light emitting diode ED and the pixel defining layer 350. The encapsulation layer 380 may include inorganic films 381 and 383 and an organic film 382 alternately stacked. An upper surface of the organic film 382 may be flatter than a lower surface of the organic film 382 so that the organic film 382 may have a planarization function.

At least one insulating layer 390 may be further disposed on the encapsulation layer 380. The insulating layer 390 may include a plurality of layers 391 and 392, and may include an organic insulating material or an inorganic insulating material. The insulating layer 390 may include an optical compensation layer for increasing light-emission efficiency.

The lens array unit 200 according to the aforementioned exemplary embodiment may be disposed on the insulating layer 390.

Figure 12:
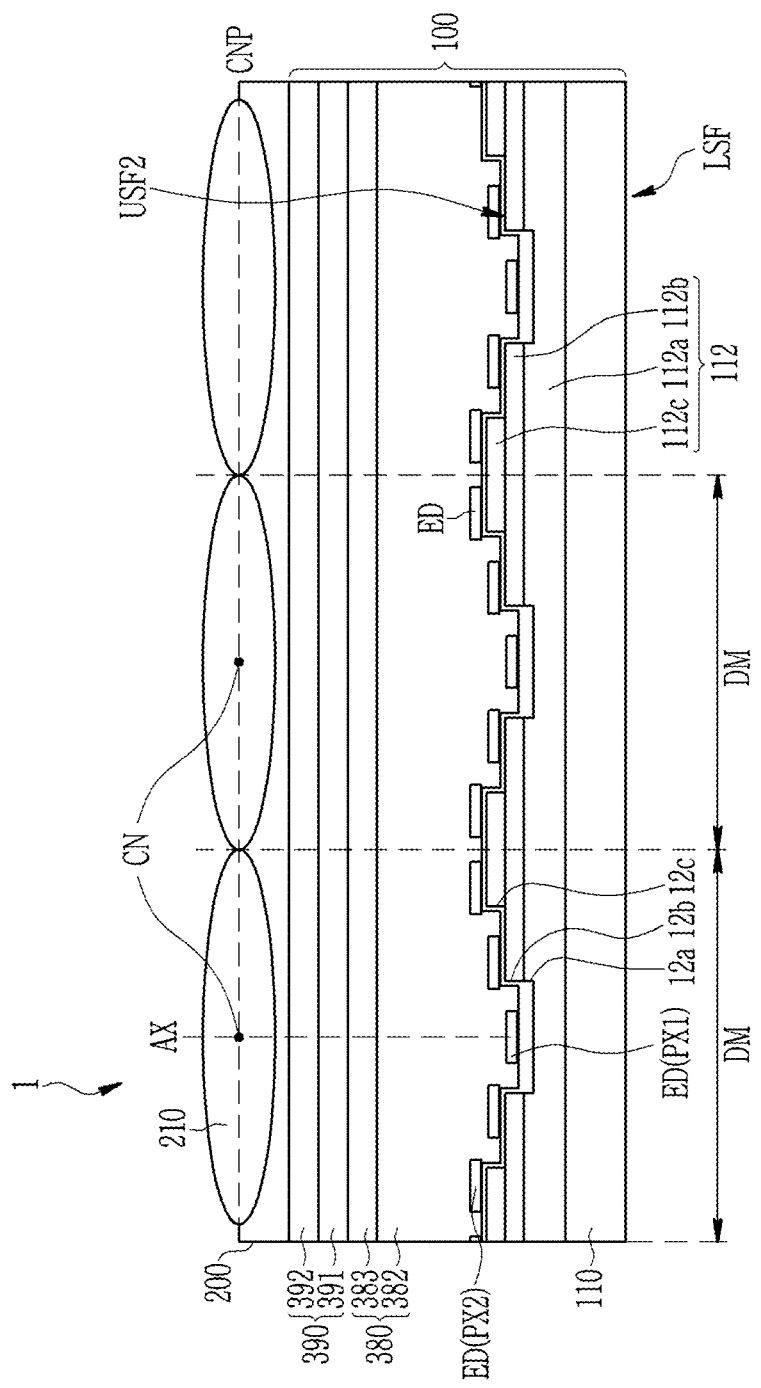
FIG. 12 is a cross-sectional view illustrating a display device according to an exemplary embodiment.
Figure 13:
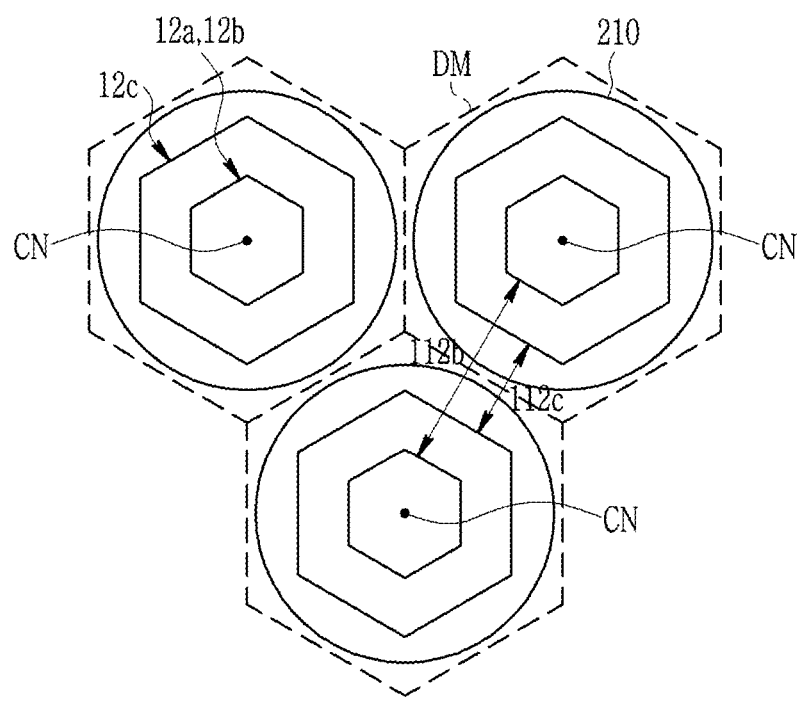
FIG. 13 and FIG. 14 are top plan views illustrating a display device shown in FIG. 12
Figure 14:
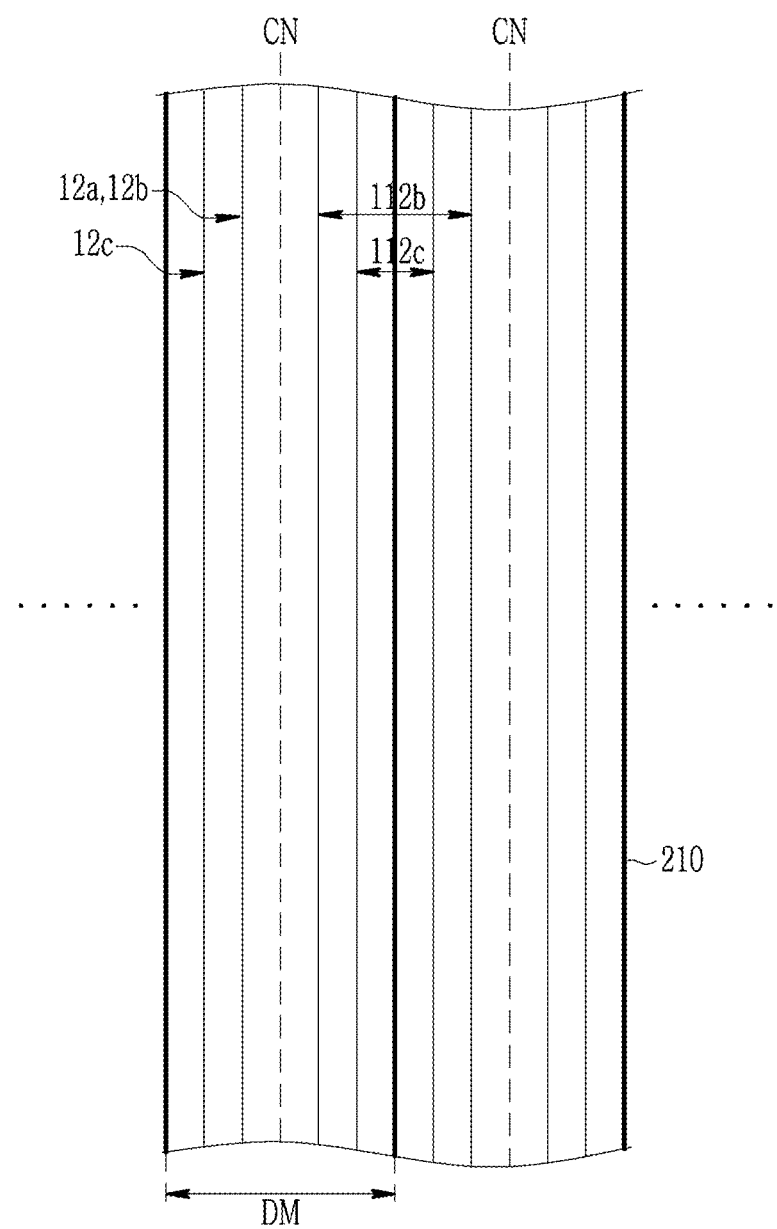

Next, referring to FIG. 12 to FIG. 14, the display device 1 according to the present exemplary embodiment is the same as most of the aforementioned exemplary embodiment of FIG. 10 and FIG. 11. However, the upper surface USF2 of the first insulating layer 112 may have a different shape. According to the present exemplary embodiment, the upper surface USF2 of the first insulating layer 112 may have a step-like shape that undergoes a periodic height change, and the height variation period may be the same as the pitch of the lens 210.

The first insulating layer 112 having the step-like shape may be formed in various ways. For example, the first insulating layer 112 may include a plurality of insulating layers 112a, 112b, and 112c which are sequentially stacked from the bottom. FIG. 12 illustrates an example in which the first insulating layer 112 includes three insulating layers 112a, 112b, and 112c.

The uppermost one of the insulating layers 112a, 112b, and 112c included in the insulating layer 112 may include an opening corresponding to the center CN of the lens 210 or the optical axis AX. In the present exemplary embodiment, the insulating layer 112c may be the uppermost insulating layer, and may include an opening 12c.

The insulating layer 112a positioned at the lowest position in the insulating layer 112 may include one continuous layer corresponding to the lenses 210 of the lens array unit 200, and a portion of a part of the insulating layer 112 corresponding to the center CN of the lens 210 is removed to form a recess portion 12a as shown in FIG. 12 to FIG. 14. The recess portion 12a may be omitted. In this case, the insulating layer 112a may be omitted.

The insulating layer 112b positioned on the insulating layer 112a may include an opening 12b corresponding to the recess portion 12a of the insulating layer 112a and a boundary aligned with the boundary of the recess portion 12a. As a result, the opening 12b may have a side surface that extends to the recess portion 12a of the insulating layer 112a.

Referring to FIG. 13 and FIG. 14, the insulating layer 112b may cover boundaries of the domains DM to extend along the boundaries of the domains DM.

The insulating layer 112c positioned on the insulating layer 112b may include an opening 12c positioned to correspond to the recess portion 12a of the insulating layer 112a and the opening 12b of the insulating layer 112b and to have an area that is greater than an area of the opening 12b. The opening 12c may surround the opening 12b, and the opening 12b may be positioned in the opening 12c in a plan view as shown in FIG. 13. Referring to FIG. 13 and FIG. 14, the insulating layer 112c may cover boundaries of the domains DM and may extend along the boundaries of the domains DM.

In this way, an additional insulating layer may be disposed on the insulating layer 112c.

Planar areas of openings included in at least two among the insulating layers 112a, 112b, and 112c included in the insulating layer 112 may be different from each other. Specifically, the planar area of the openings 12b and 12c included in the insulating layers 112b and 112c may gradually increase as the openings 12b and 12c are positioned higher based on the substrate 110 (or closer to the lens array unit 200). Planar areas of at least two of insulating layers 112a, 112b, and 112c may be different from each other. Specifically, the planar area of the openings 12b and 12c included in the insulating layers 112b and 112c may gradually increase as the insulating layers 112a, 112b, and 112c are positioned higher based on the substrate 110 (or closer to the lens array unit 200).

As illustrated in FIG. 13, when each lens 210 is a microlens, the recess portion 12a, the opening 12b, and the opening 12c may have an island shape positioned in each domain DM, and an edge shape of the recess portion 12a, the opening 12b, and the opening 12c may be similar to the shape of the domains DM, or may have another shape (e.g., a circle).

As shown in FIG. 14, when each lens 210 is a lenticular lens, the recess portion 12a, the opening 12b, and the opening 12c may have a shape that extends in a direction.

Each of the insulating layers 112a, 112b, and 112c may have a thickness depending on positions thereof on the substrate 110. The insulating layers 112a, 112b, and 112c may have a same material, and at least two layers may have different insulating materials.

As such, the upper surface USF2 of the first insulating layer 112 including the insulating layers 112a, 112b, and 112c sequentially stacked to include openings or recess portions having different sizes may have a step-like shape. Accordingly, as described above, the light emitting diodes ED positioned to correspond to the recess portion 12a of the insulating layer 112a and the opening 12b of the insulating layer 112b may correspond to the first pixel PX1. The light emitting diode ED positioned in the opening 12c of the insulating layer 112c and on the upper surface of the insulating layer 112b, and the light emitting diode ED positioned on the upper surface of the insulating layer 112c disposed uppermost may be gradually close to the central surface CNP of the lenses 210 in that order.

Figure 15:
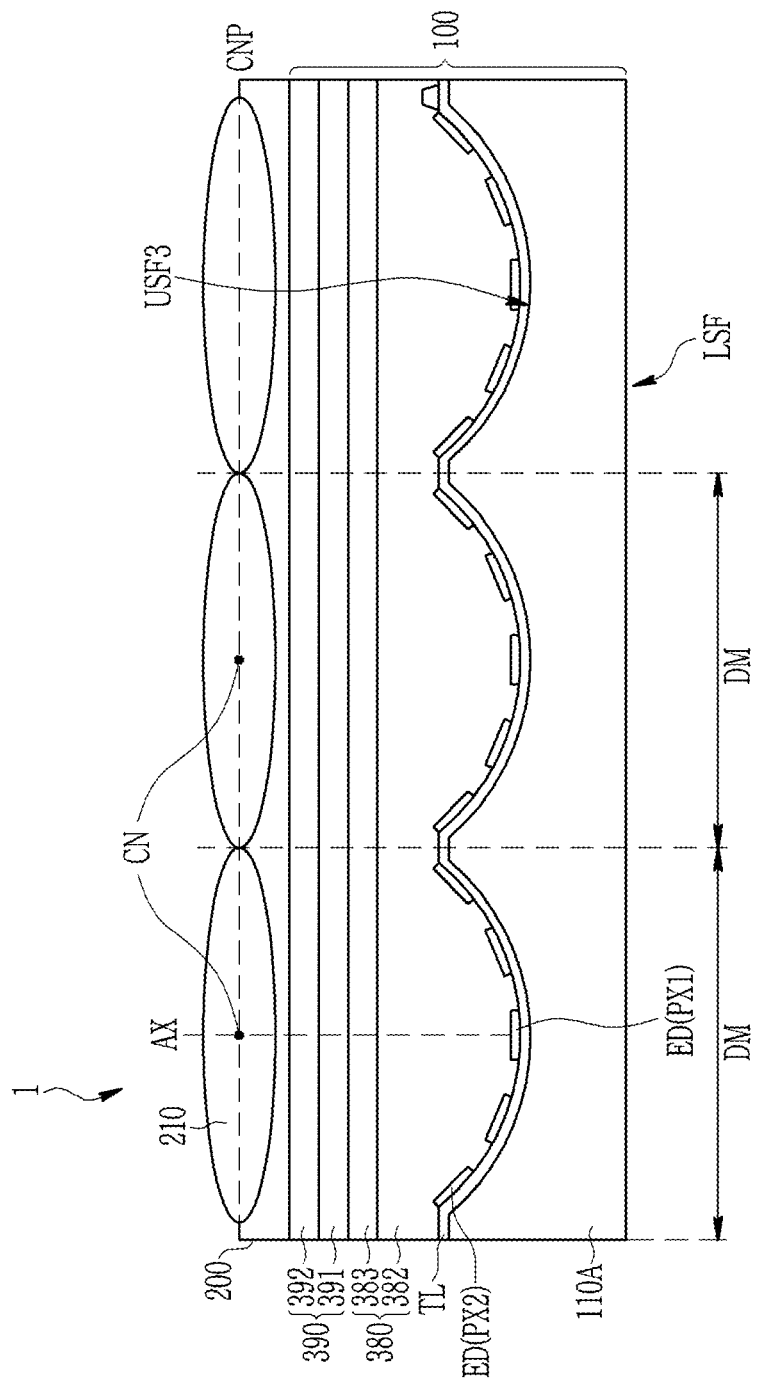
FIG. 15 is a cross-sectional view illustrating a display device according to an exemplary embodiment.
Figure 16:
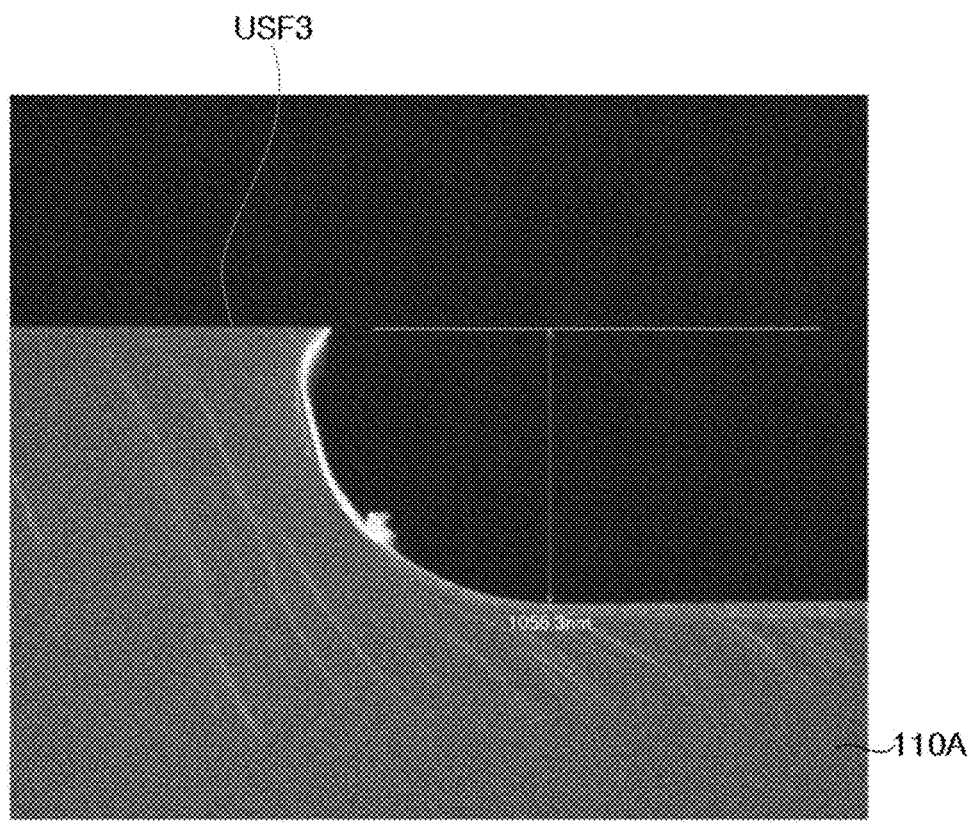
FIG. 16 is a picture illustrating a cross-section of a substrate of a display device according to an exemplary embodiment.

Next, referring to FIG. 15 and FIG. 16, the display device 1 according to the present exemplary embodiment is the same as most of the aforementioned exemplary embodiment illustrated in FIG. 10 and FIG. 11. However, the first insulating layer 112 may be omitted, and an upper surface USF3 of a substrate 110A may have a different shape. The upper surface USF3 of the substrate 110A may periodically vary, and the period may be the same as the pitch of the lens

210. Specifically, a highest portion of the upper surface USF3 of the substrate 110A may correspond to a boundary with the adjacent lens 210, and a lowest portion thereof may correspond to the center CN of the corresponding lens 210. A distance in a thickness direction between the highest portion and the lowest portion of the upper surface USF3 of the substrate 110A may be approximately several micrometers or more.

Referring to FIG. 15, the upper surface USF3 of the substrate 110A corresponding to one lens 210 may form a substantially smooth single surface (specifically, a single concave surface), but the present inventive concept is not limited thereto. That is, the upper surface USF3 of the substrate 110A corresponding to one lens 210 may have a same step-like shape as the upper surface USF2 of the first insulating layer 112.

The substrate 110A may be formed using various methods known to those of ordinary skill in the art. For example, when the substrate 110A includes glass, the upper surface USF3 of the substrate 110A may be formed by using an etching method (e.g., wet etching). When the substrate 110A includes a plastic material, the upper surface USF3 of the substrate 110A may be formed by a method such as thermoforming.

When the substrate 110A is etched by using the etching method, for example, a passivation layer such as a metal layer may be stacked on the substrate 110A, and a photosensitive layer such as a photoresist may be coated thereon, and then exposed through a photomask to form a protective layer pattern. The passivation layer pattern may include a first portion corresponding to a second portion where a height of the upper surface USF3 of the substrate 110A is highest, and a third portion where the height of the upper surface USF3 is lower than the second portion may be removed. Next, the substrate 110A may be etched by using the passivation layer pattern as an etching mask to lowly etch a portion other than the portion where the passivation layer pattern remains, thereby forming the upper surface USF3 having a height difference. In this case, various etching methods such as wet etching with various conditions can be used so as to form the upper surface USF3 which is gently curved. Thereafter, the passivation layer pattern may be removed.

FIG. 16 is a photograph illustrating how the upper surface USF3 having a concave curved surface is formed by actually performing wet etching on the upper surface of the substrate 110A.

According to an exemplary embodiment, the upper surface of the substrate 110A may have a step-like shape like the step-like upper surface USF2 of the first insulating layer 112 illustrated in FIG. 12.

Hereinafter, improved image quality when an image displayed by the display device 1 according to an embodiment is observed will be described with reference to FIG. 17 to FIG. 22 as well as the aforementioned drawings by comparing it with a comparative example.

A display device 1' according to the comparative example has almost the same structure as illustrated in FIG. 2 and FIG. 3, but the display unit 100' has a different structure. A plurality of pixels PX of the display unit 100' in a plan view are arranged according to the comparative example instead of being the focal surface FL of the lens 210. Accordingly, for one lens 210, a distance between the pixels PX and the central surface CNP of the lens 210 is substantially constant.

According to the comparative example, a first pixel PX1' disposed on the optical axis AX of the lens 210 is positioned on a focal distance of the lens 210, while a second pixel PX2' positioned out of the optical axis AX to display an image corresponding to the side viewpoint VPe is positioned out of the focal position of the lens 210 due to the Petzval field curvature. Accordingly, when being observed in the observation position OVD, the image of the second pixel PX2' may not be clearly viewed, or images of other pixels adjacent to the second pixel PX2' or a non-emission portion may be overlapped with each other, thereby generating image quality deterioration such as crosstalk, moiré, color deviation, reduction in brightness, image distortion, etc.

An effect according to an exemplary embodiment of the present inventive concept will be described with reference to simulation results illustrated in FIG. 18 to FIG. 22 by using the comparative example.

Figure 17:
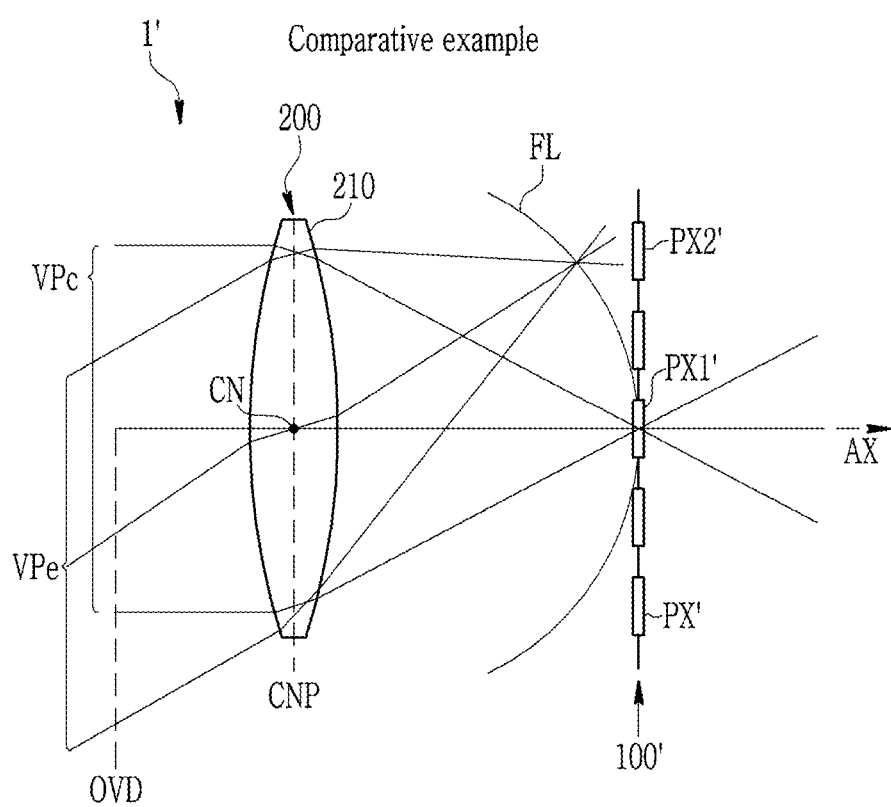
FIG. 17 illustrates a cross-section disposal relationship between pixels and a lens array unit of a display device according to a comparative example.
Figure 18:
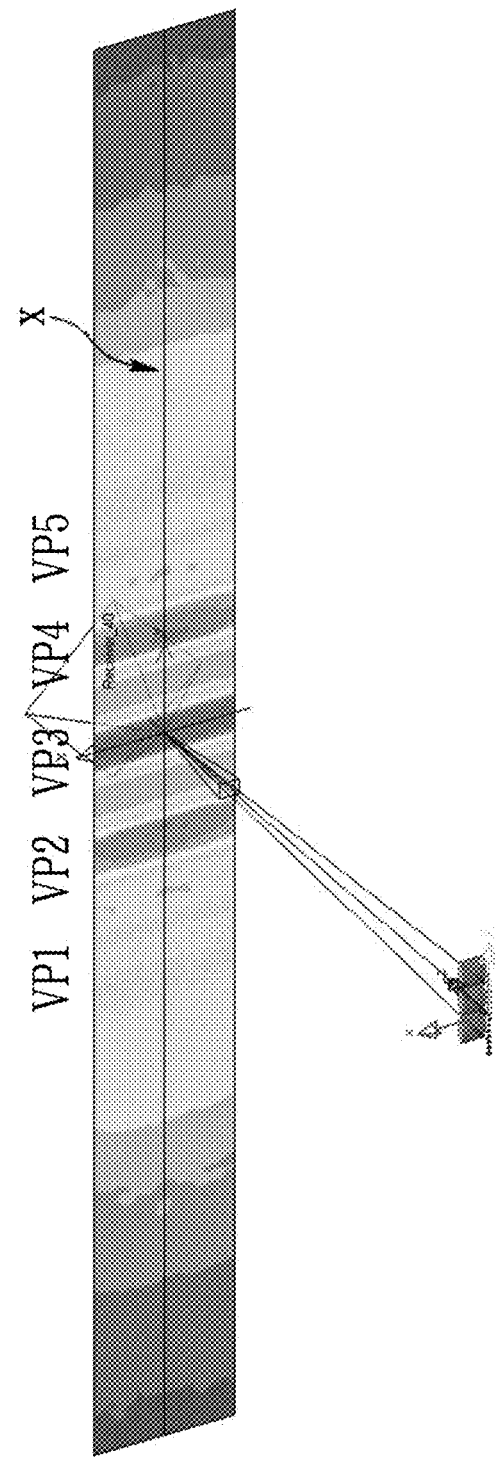
FIG. 18 is a simulation result illustrating an image obtained by observing the image displayed at an observation position by a display device according to a comparative example.
Figure 19:
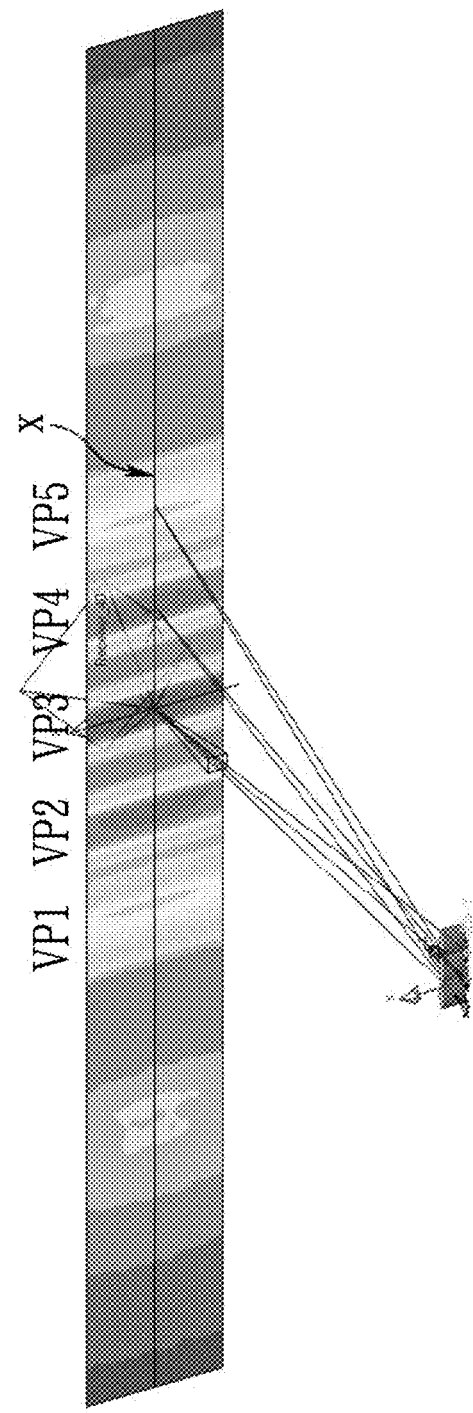
FIG. 19 is a simulation result illustrating an image obtained by observing the image displayed by a display device according to an example.
Figure 20:
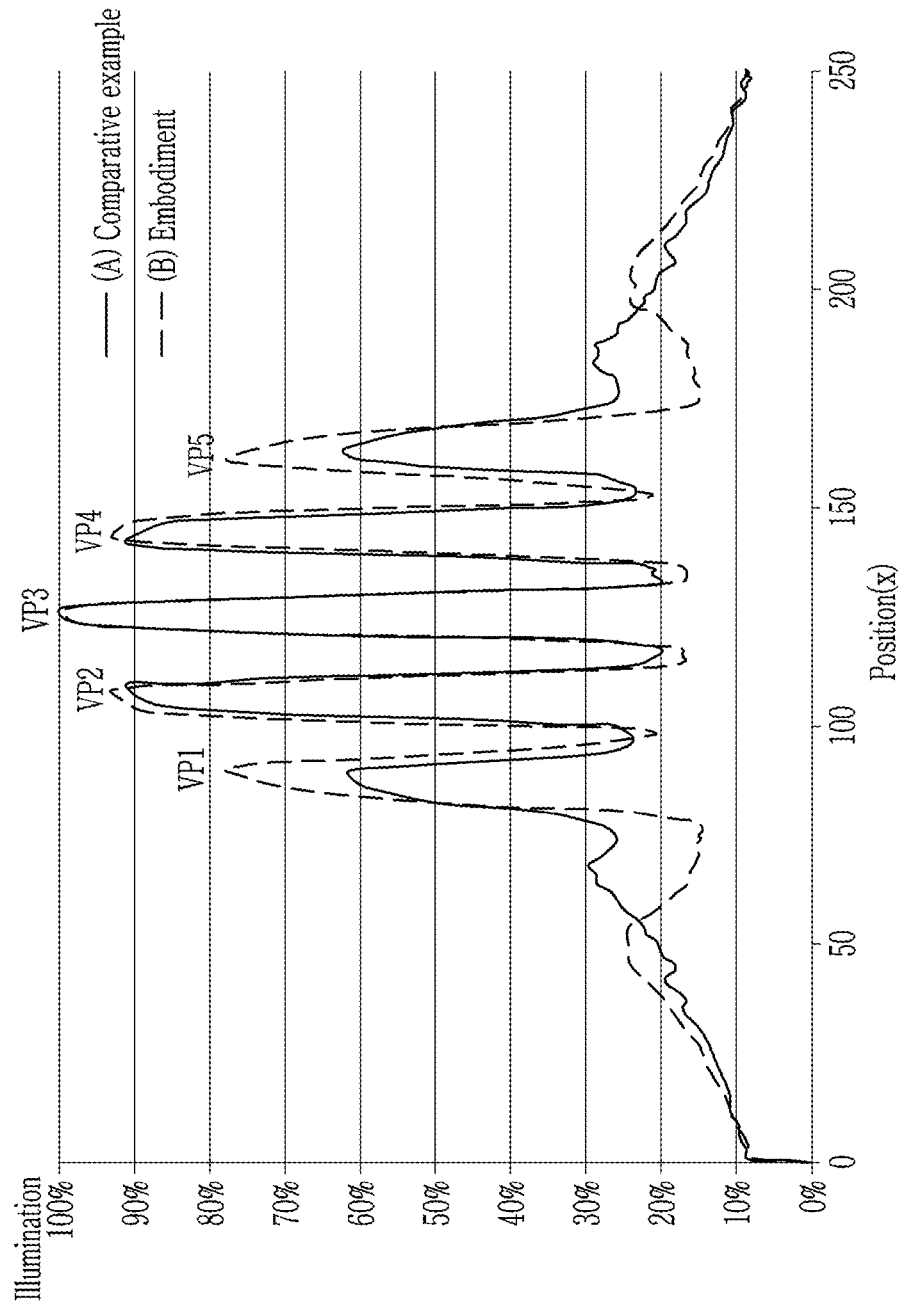
FIG. 20 is a graph illustrating changes in illuminance depending on a position of an image shown in FIG. 18 and FIG. 19.
Figure 21:
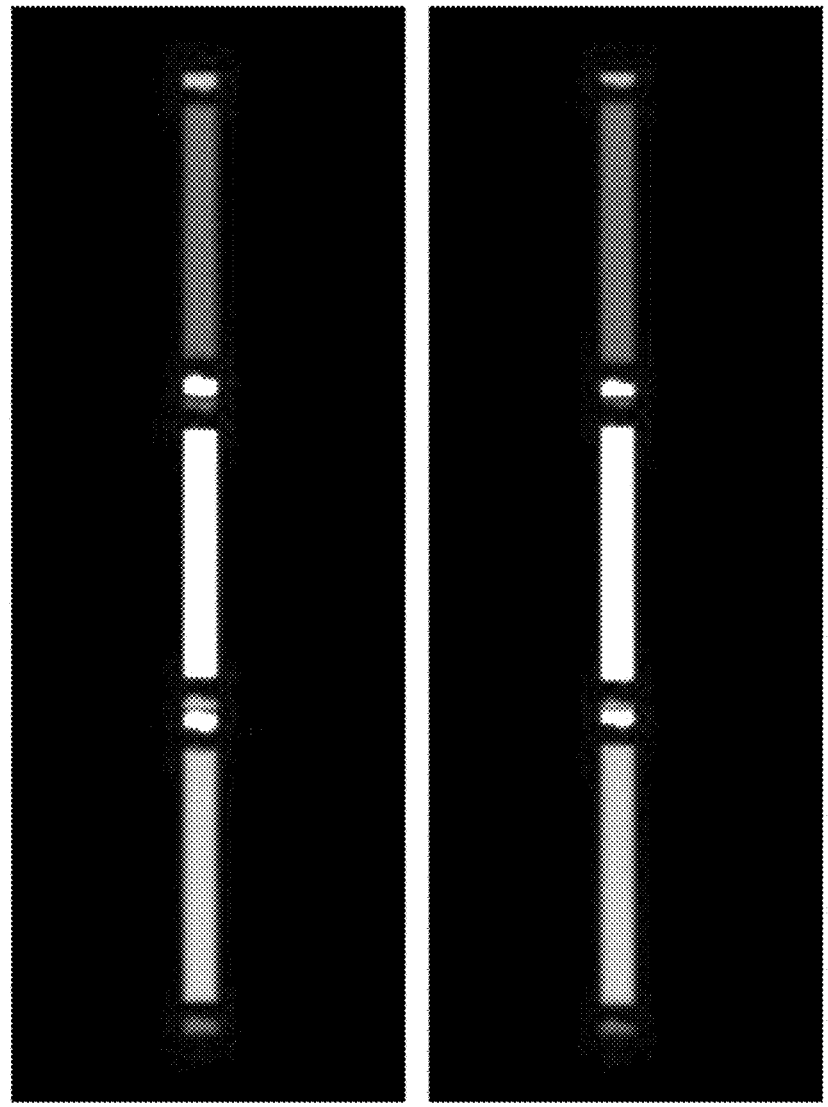
FIG. 21 is a simulation result illustrating a front image obtained by observing the image displayed by a display device in front thereof according to a comparative example and an example.

FIG. 18 shows a simulation result illustrating light amount distribution depending on an x-axis direction when an image displayed by the display device according to the comparative example (A), for example as shown in FIG. 17, is observed at the observation position OVD, while FIG. 19 shows a simulation result illustrating light amount distribution depending on the x-axis direction when an image displayed by the display device according to an embodiment (B), for example the embodiment shown in FIG. 3, is observed at the observation position OVD. The x-axis direction may be a direction in which, e.g., 5 viewpoints VP1-VP5 are arranged in the observation position OVD. FIG. 20 is a graph illustrating a first curve showing a change in the light amount distribution of FIG. 18 according to the comparative example (a), i.e., Illuminance (%) depending on x-axis positions and a second curve showing a change in the light amount distribution of FIG. 19 according to an embodiment (B), i.e., Illuminance (%) depending on x-axis positions. FIG. 21 shows simulation results illustrating images obtained by observing the display device at a viewpoint VP3 as a front view according to the comparative example (A) and an embodiment (B), respectively, and FIG. 22 shows simulation results illustrating images obtained by observing the display device at a viewpoint VP1 as a side view according to the comparative example (A) and an embodiment (B), respectively.

Referring to FIG. 20, it is seen that the illuminance according to the comparative example (A) is substantially the same as the illuminance according to an embodiment (B) at the viewpoint VP3 corresponding to the front view, so that the images observed in the frontal view are not different. Specifically, referring to FIG. 21, when being observed at the viewpoint VP3 corresponding to the front view, it is seen that there is almost no difference between the condition and luminance of the image displayed by the display device according to the comparative example (A) and the condition and luminance of the image displayed by the display device according to an embodiment (B).

Re-referring to FIG. 20, it is seen that the illuminance according to the comparative example (A) is much lower but the illuminance according to an embodiment (B) is improved to about 80%, at the viewpoints VP1 and VP5 corresponding to the side view. According to an embodiment (B), it is seen that the illuminance in the side view is increased by about 16% as compared with the comparative example (A).

Figure 22:
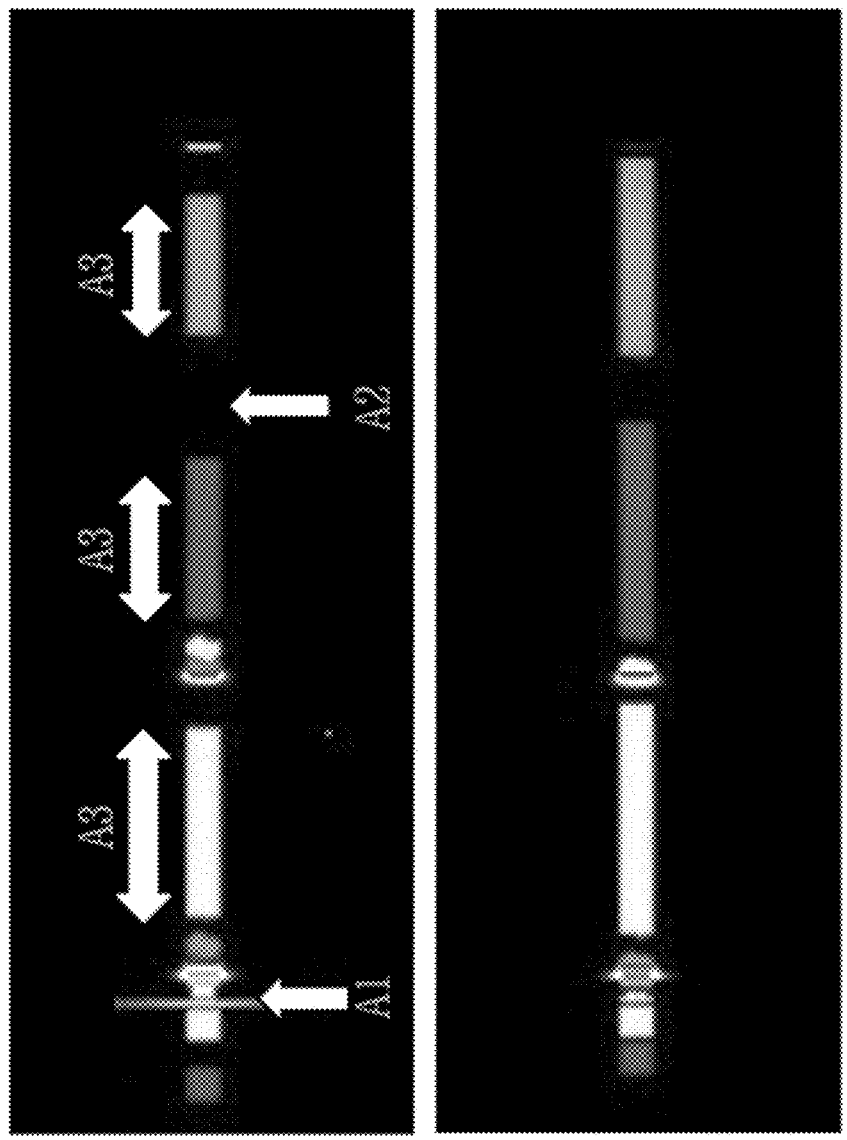
FIG. 22 is a simulation result illustrating a side image obtained by observing the image displayed by a display device at a side thereof according to a comparative example and an example.

Specifically, referring to FIG. 22, for the condition of the image displayed by the display device according to the comparative example (A) when being observed at the viewpoint VP1, crosstalk may occur in the images of the adjacent pixels as indicated by the arrow A1, and the area occupied by the non-emission portion between the adjacent pixels as shown by the arrow A2 may be widened and an interference phenomenon such as moiré may be visually recognized between the non-emission portion and the lattice pattern of the lens array unit. In addition, the size of the image displayed by the corresponding pixel is reduced to a relatively small area as shown by the arrow A3 in FIG. 22, and thus the fill factor, which is the ratio of actually visible images in the entire region, is low and the size of the pixels may be differently visually recognized depending on the positions.

In contrast, when the condition of the image display device according to an embodiment (B) is compared with the comparative example, the crosstalk may disappear and the non-emission portion between the adjacent pixels is hardly visually recognized, and the image displayed by the corresponding pixel may be displayed with a sufficient size and can be visually recognized with high luminance. As a result, according to an embodiment (B) as compared with the comparative example (A), the luminance of the image displayed by the pixel may be less decreased even in the side view, and images of the non-emission portion or other pixels adjacent thereto may not be viewed to overlap each other, thereby reducing deterioration factors of image quality.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a display unit including a plurality of pixels; and
    a lens array unit including a plurality of lenses,
    wherein a first lens of the plurality of lenses corresponds to and overlaps two or more of the plurality of pixels,
    the two or more pixels include a first pixel and a second pixel,
    the first pixel is closer to an optical axis of the first lens than the second pixel is, in a plan view, and
    a shortest distance between the first pixel and a reference surface is greater than a shortest distance between the reference surface and the second pixel, the reference surface being perpendicular to the optical axis of the first lens.

2. The display device of claim 1, wherein a shortest distance between the reference surface and the plurality of pixels changes regularly with a first period.

3. The display device of claim 2, wherein the first period is substantially a same length as a pitch of the plurality of lenses.

4. The display device of claim 3, wherein in the plan view, a shortest distance between the reference surface and the two or more pixels corresponding to the first lens decreases as a distance between the optical axis of the first lens and the two or more pixels increases.

5. The display device of claim 4, wherein the two or more pixels corresponding to the first lens are disposed along a focal surface of the first lens.

6. The display device of claim 1, wherein, when a surface through which the pixel emits light is referred to as a unit display surface, a direction in which the unit display surface of the first pixel is oriented is different from a direction in which the unit display surface of the second pixel is oriented.

7. The display device of claim 1, wherein, when a surface through which the pixel emits light is referred to as a unit display surface, a direction in which the unit display surface of the first pixel is oriented is a same direction as a direction in which the unit display surface of the second pixel is oriented.

8. The display device of claim 1, wherein
    the display unit includes a first insulating layer, a plurality of thin layers positioned on the first insulating layer, and a plurality of light emitting diodes positioned on the plurality of thin layers,
    the plurality of thin layers include a transistor electrically connected to the light emitting diode, and
    a height of an upper surface of the first insulating layer corresponding to the first pixel is lower than a height of an upper surface of the first insulating layer corresponding to the second pixel.

9. The display device of claim 8, wherein
    a shortest distance between the reference surface and the plurality of pixels changes regularly with a first period, and
    the height of the upper surface of the first insulating layer changes regularly with a same period as the first period.

10. The display device of claim 9, wherein an upper surface of the first insulating layer corresponding to the first lens forms a single curved surface.

11. The display device of claim 9, wherein the upper surface of the first insulating layer has a step-like shape.

12. The display device of claim 11, wherein the first insulating layer includes a plurality of insulating layers that are successively stacked, and
    a planar area of an opening included in at least two of the plurality of insulating layers increases closer to the lens array unit.

13. The display device of claim 12, wherein at least one of the plurality of insulating layers has an opening corresponding to the optical axis of the first lens.

14. The display device of claim 8, further comprising a substrate positioned below the first insulating layer,
    wherein an upper surface of the substrate is substantially flat.

* * * * *